(12) United States Patent
Ichiki et al.

(10) Patent No.: US 11,811,332 B2
(45) Date of Patent: Nov. 7, 2023

(54) DIRECT-CURRENT POWER SUPPLY APPARATUS, MOTOR DRIVE CONTROL APPARATUS, BLOWER, COMPRESSOR, AND AIR CONDITIONER

(71) Applicant: Mitsubishi Electric Corporation, Tokyo (JP)

(72) Inventors: Satoru Ichiki, Tokyo (JP); Takuya Shimomugi, Tokyo (JP); Koichi Arisawa, Tokyo (JP); Keisuke Uemura, Tokyo (JP); Kenji Iwazaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 284 days.

(21) Appl. No.: 17/268,286

(22) PCT Filed: Aug. 24, 2018

(86) PCT No.: PCT/JP2018/031382
§ 371 (c)(1),
(2) Date: Feb. 12, 2021

(87) PCT Pub. No.: WO2020/039579
PCT Pub. Date: Feb. 27, 2020

(65) Prior Publication Data
US 2021/0313902 A1 Oct. 7, 2021

(51) Int. Cl.
*H02M 7/219* (2006.01)
*H02M 1/42* (2007.01)
(Continued)

(52) U.S. Cl.
CPC ...... *H02M 7/219* (2013.01); *G01R 19/16538* (2013.01); *H02M 1/0032* (2021.05); *H02M 1/4233* (2013.01)

(58) Field of Classification Search
CPC .... H02M 1/42; H02M 1/4225; H02M 1/4233; H02M 1/4258; H02M 1/4266;
(Continued)

(56) References Cited

U.S. PATENT DOCUMENTS 6,038,152 A * 3/2000 Baker ............... H02M 7/219
363/126
8,975,884 B2 * 3/2015 Hulsey ............. H02M 3/1584
363/59
(Continued)

FOREIGN PATENT DOCUMENTS

EP 1601089 A1 * 11/2005 ............ H02M 1/12
JP 2017-055581 A 3/2017
JP 2018-007326 A 1/2018

*Primary Examiner* — Gustavo A Rosario-Benitez
(74) *Attorney, Agent, or Firm* — POSZ LAW GROUP, PLC

(57) ABSTRACT

A direct-current power supply apparatus includes: a reactor having one end connected to an alternating-current power supply; a bridge circuit, connected to an opposite end of the reactor, converting an alternating-current first voltage output from the alternating-current power supply into a direct-current voltage; and a current detector detecting an alternating current flowing between the alternating-current power supply and the bridge circuit. The reactor reduces an inductance in accordance with an increase of the alternating current and, when the alternating current exceeds a first current, has an inductance lower than one third of an inductance at which a current does not flow in the reactor. The bridge circuit performs an active operation when the detection value of the alternating current is larger than or equal to the first current and performs a passive operation when the detection value of the alternating current is lower than the first current.

16 Claims, 15 Drawing Sheets

(51) Int. Cl.
*H02M 1/00* (2006.01)
*G01R 19/165* (2006.01)

(58) Field of Classification Search
CPC .......... H02M 7/12; H02M 7/219; H02M 7/21; H02M 7/2195; H02M 3/015; H02M 1/12; H02M 3/1566; H02M 1/16; H02M 1/40
See application file for complete search history.

(56) References Cited

U.S. PATENT DOCUMENTS

| | | | | |
|---|---|---|---|---|
| 2011/0194321 | A1* | 8/2011 | Amano | H02M 7/219 363/126 |
| 2012/0019212 | A1* | 1/2012 | Krauer | H02J 5/00 320/137 |
| 2015/0102759 | A1* | 4/2015 | Shimomugi | H02M 1/12 318/504 |
| 2016/0103155 | A1* | 4/2016 | Mossoba | G01R 15/205 324/117 H |
| 2016/0352248 | A1* | 12/2016 | Kang | H03K 17/161 |
| 2019/0181742 | A1* | 6/2019 | Chen | H01F 30/06 |
| 2019/0319528 | A1* | 10/2019 | Matsuura | H02M 7/217 |

\* cited by examiner

DIRECT-CURRENT POWER SUPPLY APPARATUS, MOTOR DRIVE CONTROL APPARATUS, BLOWER, COMPRESSOR, AND AIR CONDITIONER

CROSS REFERENCE TO RELATED APPLICATION

This application is a U.S. national stage application of International Patent Application No. PCT/JP2018/031382 filed on Aug. 24, 2018, the contents of which are incorporated herein by reference.

FIELD

The present invention relates to a direct-current power supply apparatus that converts alternating-current power into direct-current power, a motor drive control apparatus including an AC-DC converting phase apparatus, a blower and a compressor including the motor drive control apparatus, and an air conditioner including the blower or the compressor.

BACKGROUND

A direct-current power supply apparatus is a power converting apparatus that converts alternating-current power into direct-current power. The direct-current power supply apparatus causes distortion in the current waveform during operation. Therefore, when the direct-current power supply apparatus is connected to a power system and operated, harmonics flow out to the power system. Since harmonics are a cause of failures, there are international regulations related thereto. The direct-current power supply apparatus needs to comply with the regulations.

One way to comply with the regulations on harmonics is to use switching elements as all or one or more of the rectifying elements of the direct-current power supply apparatus. An example of a switching element is a metal-oxide-semiconductor field-effect transistor (MOSFET). A direct-current power supply apparatus including a switching element is operated in an operation mode of diode rectification at light load, and operated in an operation mode of high speed switching at high load. As a result, the harmonic current that increases at high load is reduced to comply with the regulations on harmonics. An example of such a direct-current power supply apparatus is disclosed in Patent Literature 1 below.

Patent Literature 1 describes setting the inductance of the reactor connected to an alternating-current power supply to a fixed value of 3 mH to 6 mH. This prevents the reactor from increasing in size.

CITATION LIST

Patent Literature

Patent Literature 1: Japanese Patent Application Laid-open No. 2017-055581

SUMMARY

Technical Problem

The power factor in diode rectification is lower than that in high speed switching. For this reason, a reactor of an apparatus employing both diode rectification and high speed switching should have more exacting inductance values at light load than at high load to comply with the regulations on harmonics. It is thus thought that the reactor inductance range of 3 mH to 6 mH disclosed in Patent Literature 1 has been selected in consideration of the regulations on harmonics in the light-load operation region. In other words, it can be thought that Patent Literature 1 does not consider reactor loss in the high-load operation region. That is, there is room for improvement in the technique of Patent Literature 1 from the viewpoint of reducing reactor loss.

The present invention has been made in view of the above, and an object thereof is to obtain a direct-current power supply apparatus that enables further reduction in reactor loss.

Solution to Problem

In order to solve the above-mentioned problems and achieve the object, a direct-current power supply apparatus according to the present invention includes: a reactor connected at one end to an alternating-current power supply; a bridge circuit connected to another end of the reactor and converting a first voltage output from the alternating-current power supply into a direct-current voltage, the first voltage being an alternating-current voltage; and a current detector detecting an alternating current flowing between the alternating-current power supply and the bridge circuit. The reactor has a characteristic of reducing an inductance in accordance with an increase of the alternating current and causing, when the alternating current exceeds a first current, an inductance to be lower than one third of an inductance when a current does not flow in the reactor. The bridge circuit performs an active operation when the detection value of the alternating current is larger than or equal to the first current and performs a passive operation when the detection value of the alternating current is lower than the first current.

Advantageous Effects of Invention

The direct-current power supply apparatus according to the present invention achieves the effect of further reduction in reactor loss.

DESCRIPTION OF EMBODIMENTS

Hereinafter, a direct-current power supply apparatus, a motor drive control apparatus, a blower, a compressor, and an air conditioner according to embodiments of the present invention will be described in detail with reference to the accompanying drawings. The present invention is not limited to the following embodiments.

First Embodiment

Figure 1:
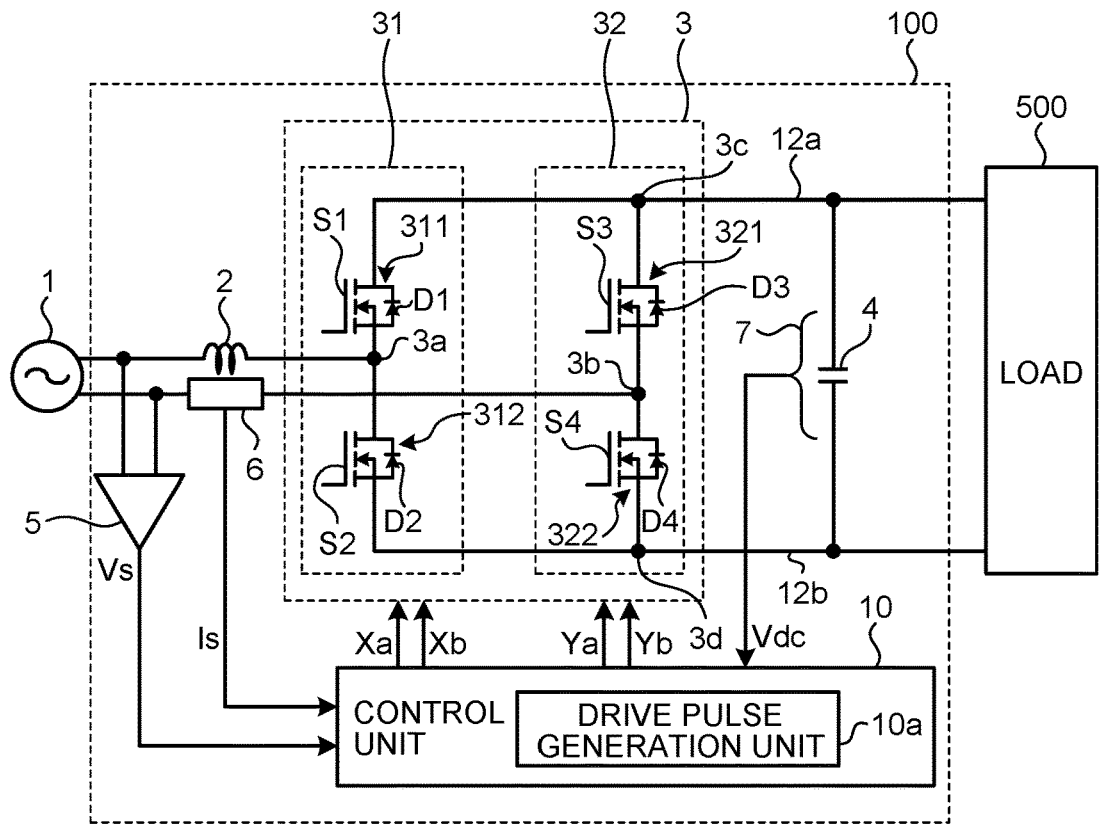
FIG. 1 is a circuit diagram illustrating a configuration of a direct-current power supply apparatus according to a first embodiment.

FIG. 1 is a circuit diagram illustrating a configuration of a direct-current power supply apparatus 100 according to the first embodiment. The direct-current power supply apparatus 100 according to the first embodiment is a power supply apparatus that converts alternating-current power supplied from a single-phase alternating-current power supply 1 into direct-current power and supplies the direct-current power to a load 500. As illustrated in FIG. 1, the direct-current power supply apparatus 100 according to the first embodiment includes a reactor 2, a bridge circuit 3, a smoothing capacitor 4, a first voltage detector 5, a current detector 6, a second voltage detector 7, and a control unit 10. An example of the load 500 is a motor incorporated in a blower, a compressor, or an air conditioner.

The bridge circuit 3 has a function of converting an alternating-current voltage output from the alternating-current power supply 1, into a direct-current voltage. The bridge circuit 3 includes a first leg 31 and a second leg 32. The first leg 31 and the second leg 32 are connected in parallel. In the first leg 31, a first upper-arm element 311 and a first lower-arm element 312 are connected in series. In the second leg 32, a second upper-arm element 321 and a second lower-arm element 322 are connected in series. One end of the reactor 2 is connected to the alternating-current power supply 1. The opposite end of the reactor 2 is connected to a connection point 3a between the first upper-arm element 311 and the first lower-arm element 312 in the first leg 31. A connection point 3b between the second upper-arm element 321 and the second lower-arm element 322 is connected to one end of the alternating-current power supply 1. In the bridge circuit 3, the connection points 3a and 3b form alternating-current terminals.

In FIG. 1, the reactor 2 is connected between the opposite end of the alternating-current power supply 1 and the connection point 3a, but may be connected between the one end of the alternating-current power supply 1 and the connection point 3b.

In the bridge circuit 3, the side on which the connection points 3a and 3b are located is referred to as the "alternating-current side". The voltage output from the alternating-current power supply 1 is referred to as the "power supply voltage", and the cycle of the power supply voltage is referred to as the "power supply cycle". Note that the power supply voltage may also be referred to as the "first voltage".

The first upper-arm element 311 includes a switching element S1 and a diode D1 connected in antiparallel to the switching element S1. The first lower-arm element 312 includes a switching element S2 and a diode D2 connected in antiparallel to the switching element S2. The second upper-arm element 321 includes a switching element S3 and a diode D3 connected in antiparallel to the switching element S3. The second lower-arm element 322 includes a switching element S4 and a diode D4 connected in antiparallel to the switching element S4.

FIG. 1 shows a MOSFET as a non-limiting example of each of the switching elements S1, S2, S3, and S4. A MOSFET is a switching element that allows current to flow in both directions between the drain and the source. Any switching element may be used as long as it is a bidirectional element, which allows current to flow in both directions between the first terminal corresponding to the drain and the second terminal corresponding to the source.

The term "antiparallel" means that the first terminal corresponding to the drain of the MOSFET is connected to the cathode of the diode and the second terminal corresponding to the source of the MOSFET is connected to the anode of the diode. Note that the diode may be a parasitic diode contained in the MOSFET itself. Parasitic diodes are also called body diodes.

At least one of the switching elements S1, S2, S3, and S4 is not limited to a MOSFET formed of a silicon-based material, but may be a MOSFET formed of a wide bandgap semiconductor such as silicon carbide, a gallium nitride based material, or diamond.

In general, wide bandgap semiconductors have higher withstand voltage and heat resistance than silicon semiconductors. Using a wide bandgap semiconductor for at least one of the switching elements S1, S2, S3, and S4 increases the withstand voltage property and allowable current density of the switching elements are increased, which can contribute to reducing the size of the semiconductor module incorporating the switching elements.

One end of the smoothing capacitor 4 is connected to a direct-current bus 12a on the high-potential side. The direct-current bus 12a is drawn from a connection point 3c between the first upper-arm element 311 in the first leg 31 and the second upper-arm element 321 in the second leg 32. The opposite end of the smoothing capacitor 4 is connected to a direct-current bus 12b on the low-potential side. The direct-current bus 12b is drawn from a connection point 3d between the first lower-arm element 312 in the first leg 31 and the second lower-arm element 322 in the second leg 32. In the bridge circuit 3, the connection points 3c and 3d form direct-current terminals. In the bridge circuit 3, the side on which the connection points 3c and 3d are located is referred to as the "direct-current side".

The voltage output from the bridge circuit 3 is applied to the both ends of the smoothing capacitor 4. The smoothing capacitor 4 smooths the voltage output from the bridge circuit 3. The smoothing capacitor 4 is connected to the direct-current buses 12a and 12b, and the voltage smoothed by the smoothing capacitor 4 is referred to as the "bus voltage". Note that the bus voltage may also be referred to as the "second voltage". The bus voltage is also applied to the load 500.

The first voltage detector 5 is connected in parallel with the both ends of the alternating-current power supply 1. The first voltage detector 5 detects the power supply voltage and outputs a detection value Vs of the power supply voltage to the control unit 10. The power supply voltage is the absolute value of the instantaneous voltage of the alternating-current power supply 1.

The current detector 6 detects an alternating current flowing between the alternating-current power supply 1 and the bridge circuit 3 and outputs a detection value Is of the alternating current to the control unit 10.

The second voltage detector 7 is connected in parallel with the both ends of the smoothing capacitor 4. The second voltage detector 7 detects the bus voltage and outputs a detection value Vdc of the bus voltage to the control unit 10. The control unit 10 includes a drive pulse generation unit 10a.

The drive pulse generation unit 10a is configured using a computing element which is a computing means. An example of the computing element is a microcomputer. Alternatively, the computing element may be a processor or a processing device called a central processing unit (CPU), a microprocessor, or a digital signal processor (DSP).

On the basis of the detection value Vs from the first voltage detector 5, the detection value Is from the current detector 6, and the detection value Vdc from the second voltage detector 7, the drive pulse generation unit 10a generates a drive pulse for driving the switching element of each arm element provided in the bridge circuit 3.

Hereinafter, "driving the switching element of each arm element" will be described as "driving each arm element" for the sake of convenience. In order to distinguish between the drive pulses for driving the arm elements, the drive pulse for driving the first upper-arm element 311 may be referred to as the "first drive pulse", the drive pulse for driving the first lower-arm element 312 may be referred to as the "second drive pulse", the drive pulse for driving the second upper-arm element 321 may be referred to as the "third drive pulse", and the drive pulse for driving the second lower-arm element 322 may be referred to as the "fourth drive pulse". The first drive pulse corresponds to Xa in the drawings, the second drive pulse corresponds to Xb in the drawings, the third drive pulse corresponds to Ya in the drawings, and the fourth drive pulse corresponds to Yb in the drawings.

Figure 2:
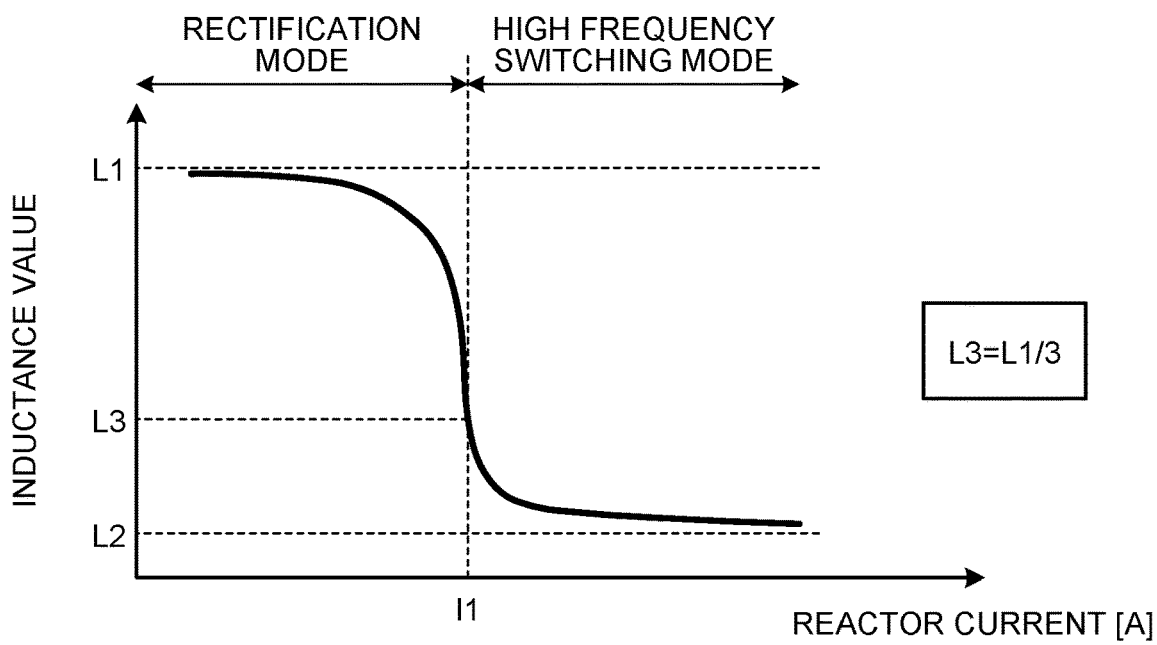
FIG. 2 is a diagram illustrating the current characteristics of the inductance of a reactor in the first embodiment.

FIG. 2 is a diagram illustrating the current characteristics of the inductance of the reactor 2 in the first embodiment. In FIG. 2, the horizontal axis represents the reactor current, which is the current flowing through the reactor 2, and the vertical axis represents the inductance of the reactor 2. As illustrated in FIG. 2, the inductance of the reactor 2 in the first embodiment has a change point at which the inductance greatly changes. Here, the current at the change point is referred to as the "first current".

In FIG. 2, L1 is the inductance that occurs when the reactor current does not flow. The value of L1 is several mH to several tens of mH. The characteristic of the inductance of the reactor 2 is that the inductance value is substantially maintained at L1 as the reactor current increases, but sharply decreases around the first current I1 of the reactor current.

When the reactor current exceeds the first current I1, the amount of decrease in the inductance of the reactor 2 becomes small, and the inductance of the reactor 2 converges toward the value L2. That is, the characteristic of the reactor 2 in the first embodiment is that the inductance changes, with respect to the reactor current, stepwise at the first current I1. The value of L2 is several hundred pH to several mH.

FIG. 2 also illustrates the operation region of the bridge circuit 3. The bridge circuit 3 operates in a rectification mode in the region where the reactor current is lower than the first current I1, and operates in a high frequency switching mode in the region where the reactor current is larger than or equal to the first current I1. Operations in the rectification mode and the high frequency switching mode will be described later.

FIG. 2 illustrates that the inductance of the reactor 2 changes stepwise at the first current I1, which is a non-limiting characteristic. The inductance of the reactor 2 may have a characteristic of changing more gradually than in FIG. 2 as long as the inductance decreases toward L2 as the reactor current increases in excess of the first current I1.

Next, the current characteristics of the inductance of the reactor 2 in the first embodiment will be quantitatively defined. Here, the relationship between L1 and L3 can be represented by the following formula, where L3 is the inductance at the first current I1.

$$L3 = L1/3 \tag{1}$$

Specifically, the inductance L3 at the first current I1 is set to one third of the inductance L1 at which the reactor current does not flow.

In the case where the reactor 2 illustrated in FIG. 1 employs the reactor characteristics illustrated in FIG. 2, the value of the first current I1 can be defined by Formula (1). In the case where to the reactor 2 illustrated in FIG. 1 employs the reactor characteristics illustrated in FIG. 2, the reactor 2 is inserted between the alternating-current power supply 1 and the bridge circuit 3, and an alternating current flows through the reactor 2. In this case, the current value at which the inductance of the reactor 2 is one third of the inductance at which no alternating current flows can be defined as the first current I1.

Figure 3:
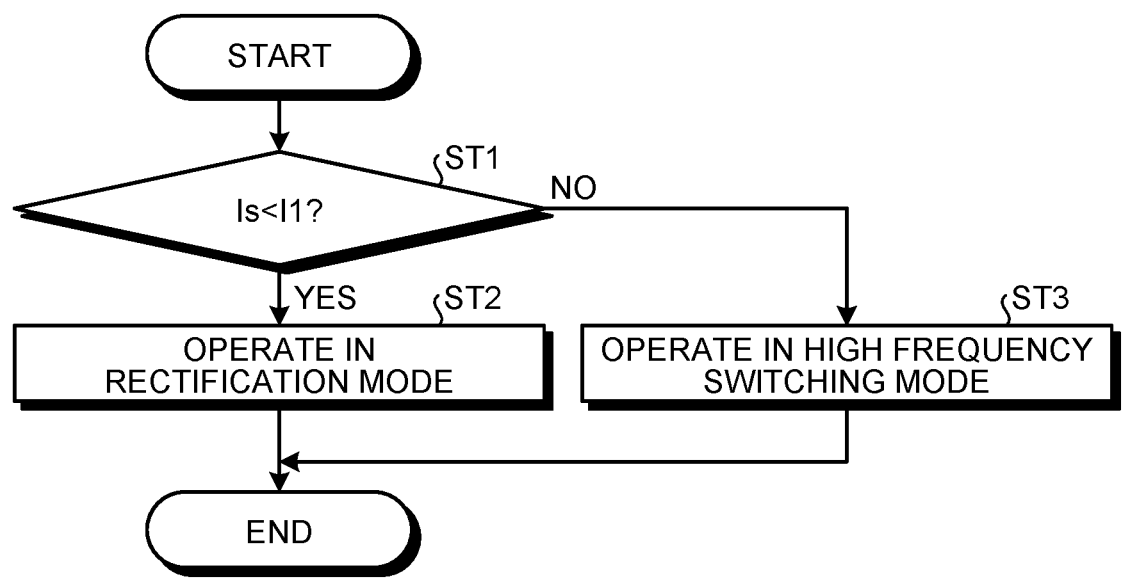
FIG. 3 is a flowchart for explaining the operation of the main part of the direct-current power supply apparatus according to the first embodiment.

FIG. 3 is a flowchart for explaining the operation of the main part of the direct-current power supply apparatus 100 according to the first embodiment.

In FIG. 3, when the detection value Is of the alternating current is lower than the first current I1 (step ST1: Yes), the control unit 10 causes the bridge circuit 3 to operate in the rectification mode (step ST2). The rectification mode is a passive mode in which the switching elements of the bridge circuit 3 are not turned on and off except for synchronous rectification. Therefore, the operation of the bridge circuit 3 in the rectification mode is referred to as the "passive operation". Details of the passive operation will be described later.

In FIG. 3, when the detection value Is of the alternating current is larger than or equal to the first current I1 (step ST1: No), the control unit 10 causes the bridge circuit 3 to operate in the high frequency switching mode (step ST3). The high frequency switching mode is a mode in which the switching elements of the bridge circuit 3 are switched at a carrier frequency of several kHz to several tens of kHz. Note that the high frequency switching mode is a mode in which the switching elements of the bridge circuit 3 are actively turned on and off. Therefore, the operation of the bridge circuit 3 in the high frequency switching mode is referred to as the "active operation". Details of the active operation will also be described later.

Note that synchronous rectification may be performed in both the rectification mode and the high frequency switching mode. Synchronous rectification is a control method in which a switching element connected in antiparallel to a diode is turned on at the timing of flow of a current through the diode. Details of synchronous rectification will be described later.

Next, the basic circuit operation of the direct-current power supply apparatus 100 according to the first embodiment will be described with reference to FIGS. 1 and 4 to 11.

Figure 4:
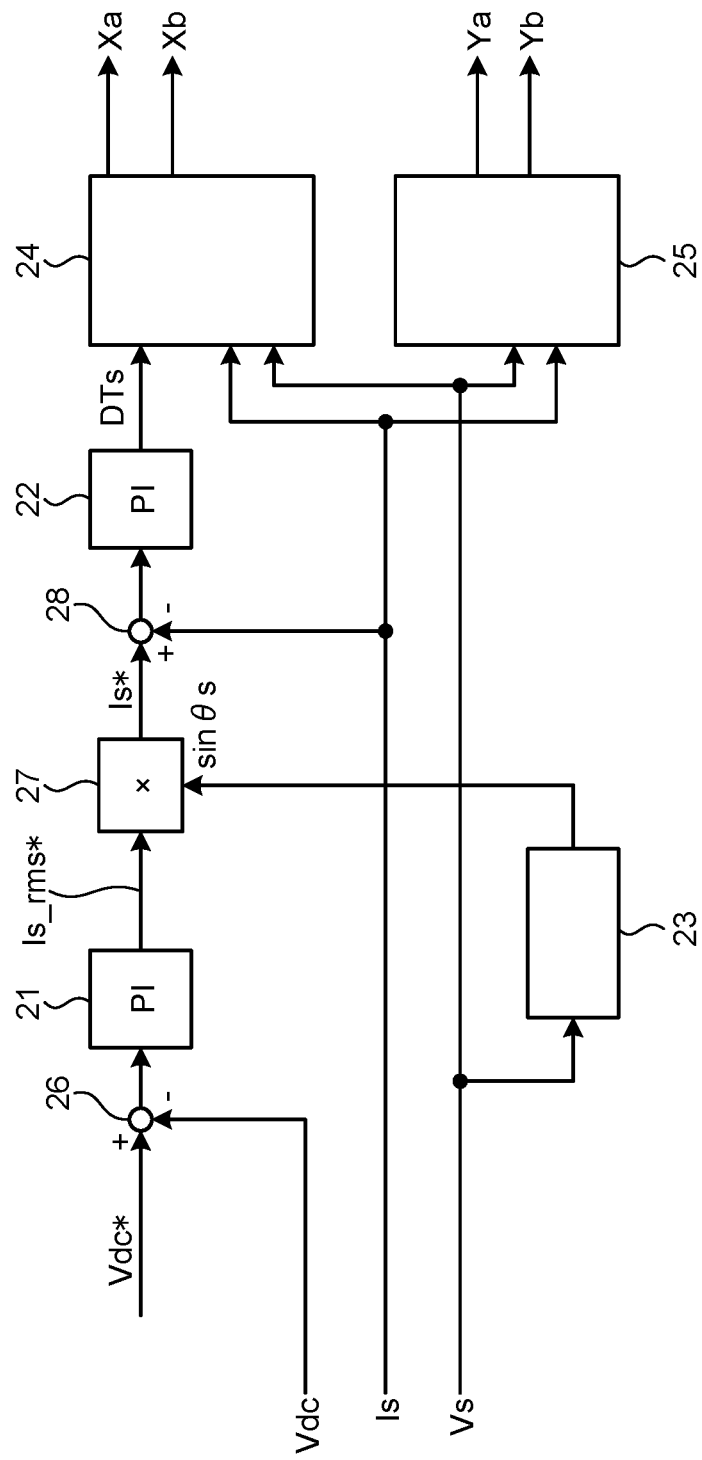
FIG. 4 is a diagram illustrating an exemplary configuration of a drive pulse generation unit in the direct-current power supply apparatus of the first embodiment.

Referring first to FIG. 4, there is illustrated an exemplary configuration of the drive pulse generation unit 10*a* in the direct-current power supply apparatus 100 of the first embodiment. As illustrated in FIG. 4, the drive pulse generation unit 10*a* includes a current command value control unit 21, an on-duty control unit 22, a power supply voltage phase calculation unit 23, a first arm pulse generation unit 24, a second arm pulse generation unit 25, subtractors 26 and 28, and a multiplier 27.

The subtractor 26 computes the difference between the detection value Vdc of the bus voltage detected by the second voltage detector 7 and a preset bus voltage command value Vdc*. The current command value control unit 21 computes a current effective value command value Is_rms* on the basis of the difference between the detection value Vdc of the bus voltage and the bus voltage command value Vdc*. The computation of the current effective value command value Is_rms* can be implemented by proportional integral (PI) control on the difference between the detection value Vdc of the bus voltage and the bus voltage command value Vdc*. Note that PI control is an example, and proportional (P) control or proportional integral differential (PID) control may be adopted instead of PI control.

The power supply voltage phase calculation unit 23 receives input of the detection value Vs of the power supply voltage detected by the first voltage detector 5 and computes a power supply voltage phase estimated value $\theta$s and a sine value sin$\theta$s of the power supply voltage phase estimated value $\theta$s.

The multiplier 27 multiplies the current effective value command value Is_rms* output from the current command value control unit 21, by the sine value sin$\theta$s of the power supply voltage phase estimated value $\theta$s output from the power supply voltage phase calculation unit 23. The output from the multiplier 27 is input to the subtractor 28 as a current instantaneous value command value Is*.

The subtractor 28 computes the difference between the current instantaneous value command value Is* and the detection value Is of the alternating current detected by the current detector 6. The output from the subtractor 28 is input to the on-duty control unit 22.

The on-duty control unit 22 computes a reference on-duty DTs on the basis of the difference between the current instantaneous value command value Is* and the detection value Is of the alternating current. The reference on-duty DTs is used for generating the first drive pulse Xa for driving the first upper-arm element 311 and the second drive pulse Xb for driving the first lower-arm element 312. The computation of the reference on-duty DTs is performed by PI control on the difference between the current instantaneous value command value Is* and the detection value Is of the alternating current. Note that the on-duty control unit 22 may also employ P control or PID control, instead of PI control.

Figure 5:
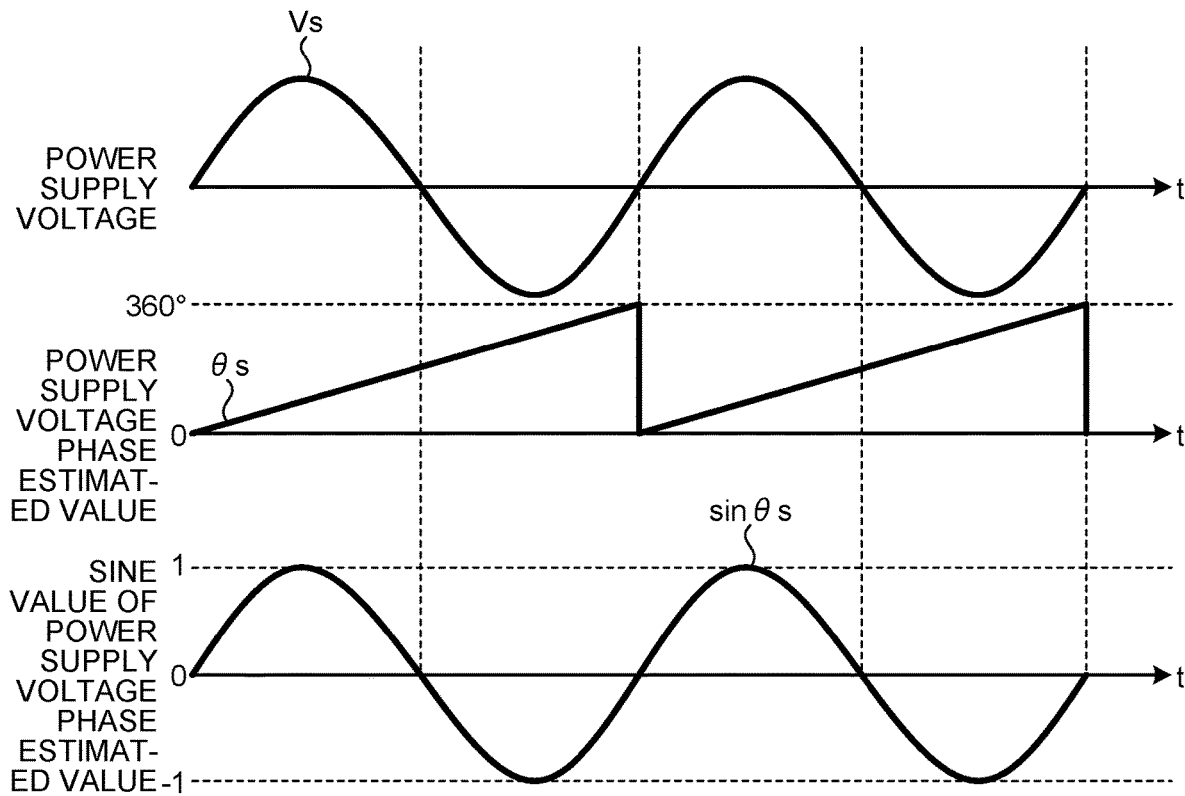
FIG. 5 is a diagram illustrating an example of how a power supply voltage phase calculation unit illustrated in FIG. 4 operates.

FIG. 5 is a diagram illustrating an example of how the power supply voltage phase calculation unit 23 illustrated in FIG. 4 operates. Note that FIG. 5 illustrates the waveforms under ideal conditions free from any delay due to control or any delay due to detection processing. As illustrated in FIG. 5, the power supply voltage phase estimated value $\theta$s is 360° at a point where the power supply voltage switches from negative to positive. The power supply voltage phase calculation unit 23 detects a point where the power supply voltage switches from negative to positive, and resets the power supply voltage phase estimated value $\theta$s to zero at this switching point. In a case where the interrupt function of a microcomputer is used, a circuit for zero-cross detection from the power supply voltage can be added to FIG. 4. In any case, any method may be used as long as the phase of the power supply voltage can be detected.

Figure 6:
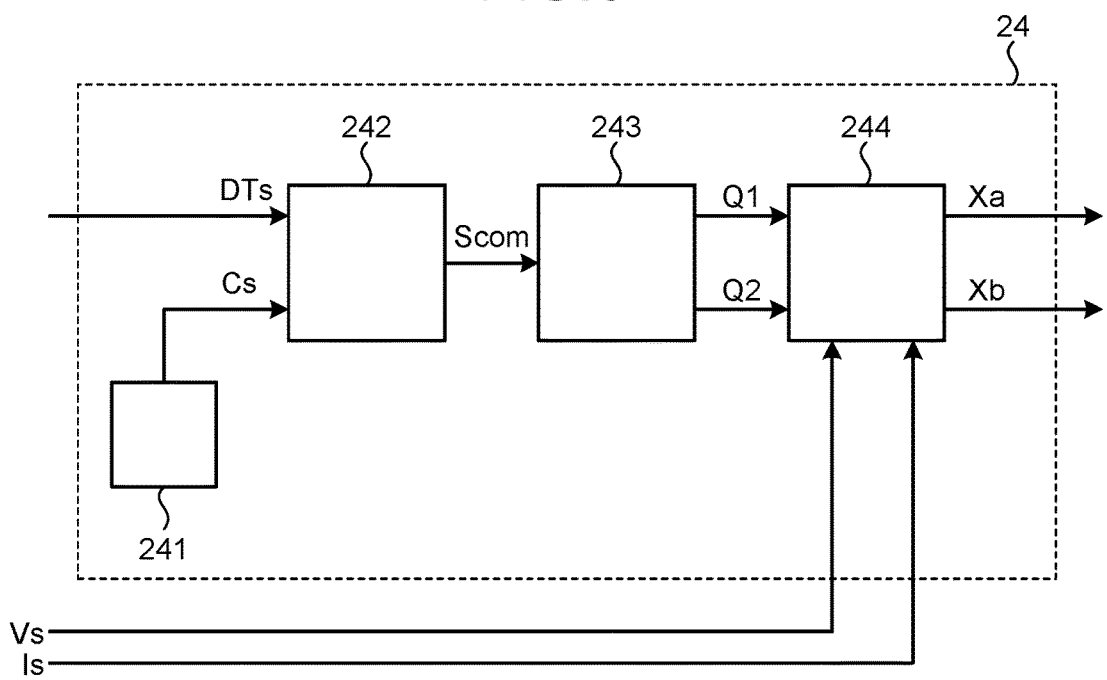
FIG. 6 is a block diagram illustrating an exemplary configuration of a first arm pulse generation unit illustrated in FIG. 4.
Figure 7:
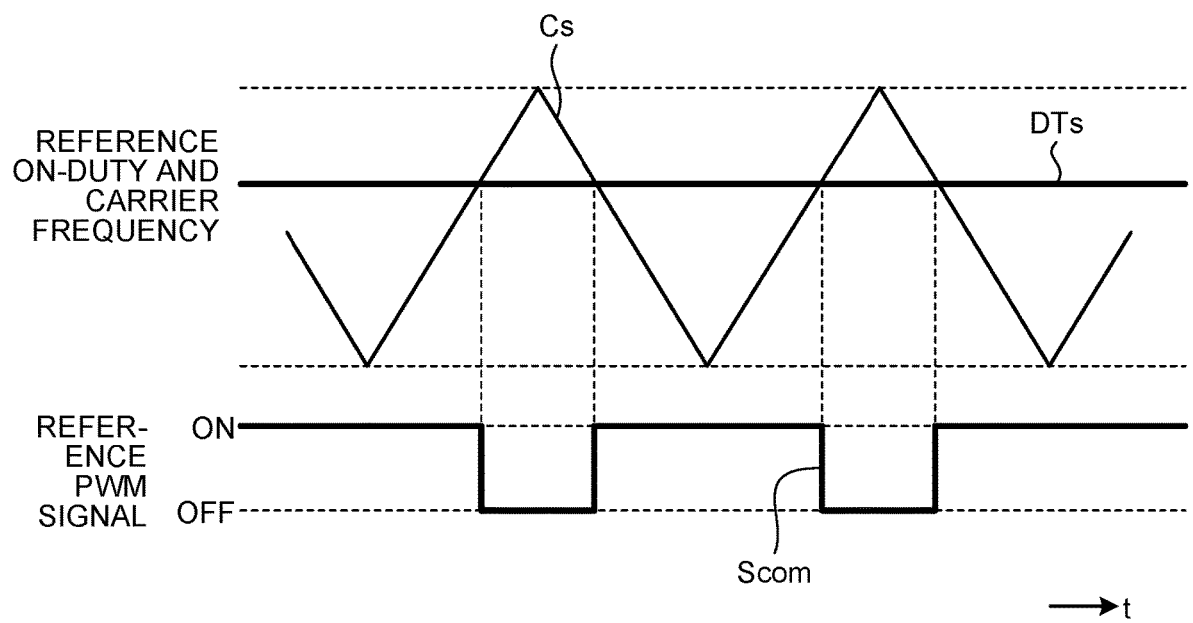
FIG. 7 is a diagram for explaining a method of generating a reference pulse width modulation (PWM) signal generated inside the first arm pulse generation unit illustrated in FIG. 6.
Figure 8:
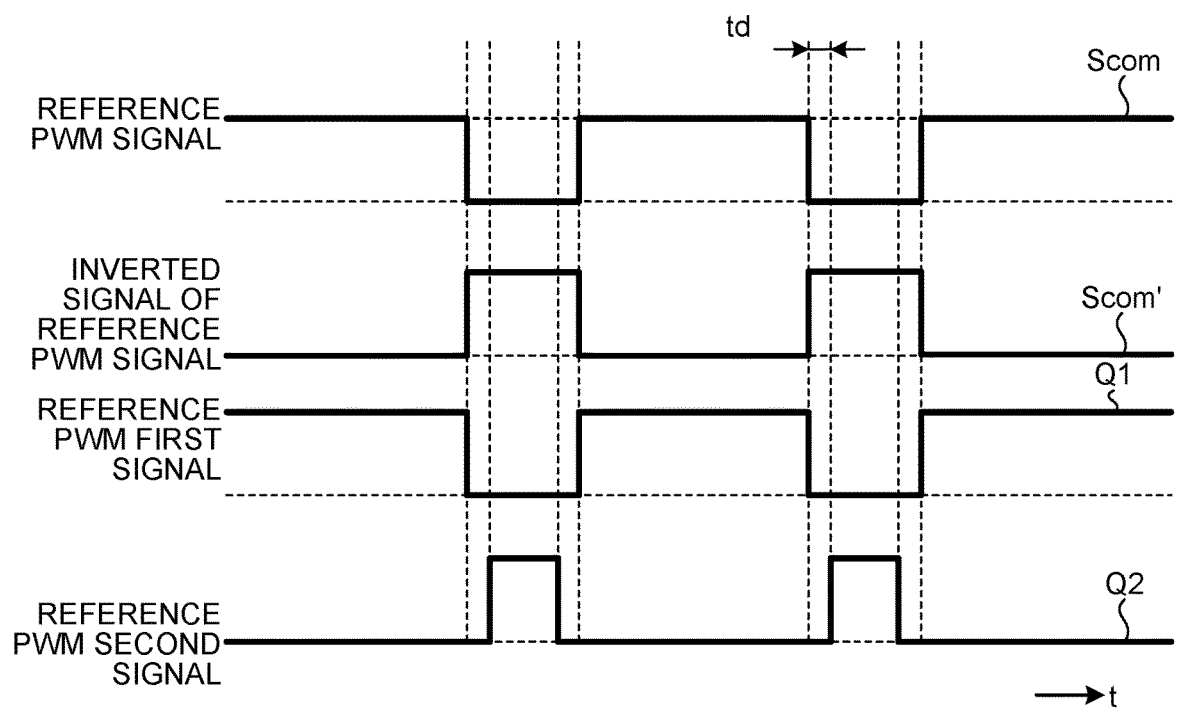
FIG. 8 is a diagram for explaining a dead time set inside the first arm pulse generation unit illustrated in FIG. 6.

FIG. 6 is a block diagram illustrating an exemplary configuration of the first arm pulse generation unit 24 illustrated in FIG. 4. FIG. 7 is a diagram for explaining a method of generating a reference PWM signal Scom generated inside the first arm pulse generation unit 24 illustrated in FIG. 6. FIG. 8 is a diagram for explaining a dead time set inside the first arm pulse generation unit 24 illustrated in FIG. 6.

As illustrated in FIG. 6, the first arm pulse generation unit 24 includes a carrier generation unit 241, a reference PWM signal generation unit 242, a dead time generation unit 243, and a pulse selector unit 244. The carrier generation unit 241 generates a carrier Cs for generating the reference PWM signal Scom. The frequency of the carrier Cs is called a "carrier frequency", and the cycle of the carrier Cs is called a "carrier cycle".

As illustrated in FIG. 7, the reference PWM signal generation unit 242 generates the reference PWM signal Scom by comparing the magnitude of the reference on-duty DTs and the magnitude of the carrier Cs. In the example of FIG. 7, the reference PWM signal Scom is generated by setting the reference PWM signal Scom to an ON signal in the case of DTs>Cs and setting the reference PWM signal Scom to an OFF signal in the case of DTs<Cs. Although FIG. 7 illustrates an example of active high in which the level of the ON signal is higher than that of the OFF signal, active low may be used, in which the level of the ON signal is lower than that of the OFF signal.

The ON state or OFF state of the first upper-arm element 311 and the ON state or OFF state of the first lower-arm element 312 are controlled on the basis of the reference PWM signal Scom. The first upper-arm element 311 and the first lower-arm element 312 perform mutually inverted operations on the basis of the reference PWM signal Scom and an inverted signal Scom'.

However, a switching element generally has a delay time in the transition from the ON state to the OFF state and in the transition from the OFF state to the ON state. Mere use of the reference PWM signal Scom and the inverted signal Scom' results in a short circuit occurring between the first upper-arm element 311 and the first lower-arm element 312. To address this problem, the dead time generation unit 243 generates a dead time td for the reference PWM signal Scom and the inverted signal Scom' that is an inverse of the reference PWM signal Scom. The dead time td is necessary to prevent such a short circuit phenomenon. That is, the dead time td is set to prevent the switching elements from short-circuiting. FIG. 8 illustrates an example of active-high signal waveforms that contain the dead time td.

In FIG. 8, Q1 is the same signal as the reference PWM signal Scom. Q2 is an inverted signal of Q1 and is set to be shorter on both sides of the ON period by the dead time td. The dead time td is a period in which both the first upper-arm element 311 and the first lower-arm element 312 are OFF. Hereinafter, Q1 is referred to as the "reference PWM first signal", and Q2 is referred to as the "reference PWM second signal". Any known method other than that illustrated in FIG. 8 may be used.

Figure 9:
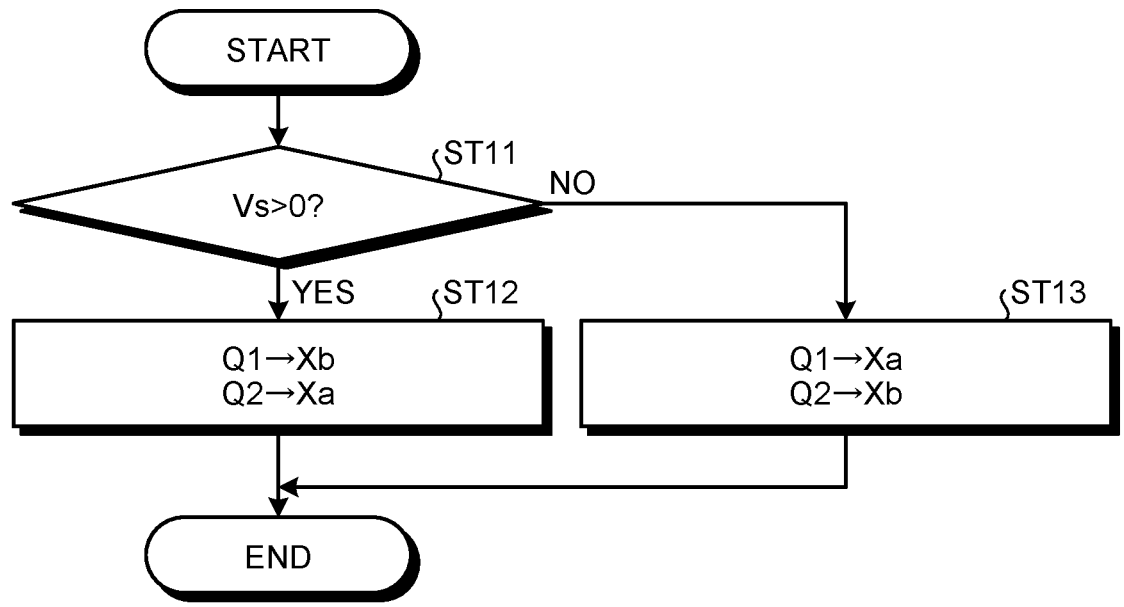
FIG. 9 is a flowchart for explaining the operation of the first arm pulse generation unit illustrated in FIGS. 4 and 6.

Returning to FIG. 6, the pulse selector unit 244 determines to which of the first upper-arm element 311 and the first lower-arm element 312 one of the reference PWM first signal Q1 and the reference PWM second signal Q2 is transmitted. FIG. 9 is a flowchart for explaining the operation of the first arm pulse generation unit 24 illustrated in FIGS. 4 and 6.

In FIG. 9, when the detection value Vs of the power supply voltage is positive (step ST11: Yes), the pulse selector unit 244 outputs the reference PWM first signal Q1 as a drive pulse for the first lower-arm element 312 (step ST12). The notation "Q1→Xb" means this control. When the detection value Vs of the power supply voltage is positive (step ST11: Yes), the pulse selector unit 244 outputs the reference PWM second signal Q2 as a drive pulse for the first upper-arm element 311 (step ST12). The notation "Q2→Xa" means this control.

When the detection value Vs of the power supply voltage is negative or zero (step ST11: No), the pulse selector unit 244 outputs the reference PWM first signal Q1 as a drive pulse for the first upper-arm element 311 (step ST13). The notation "Q1→Xa" means this control. When the detection value Vs of the power supply voltage is negative or zero (step ST11: No), the pulse selector unit 244 outputs the reference PWM second signal Q2 as a drive pulse for the first lower-arm element 312 (step ST13). The notation "Q2→Xb" means this control.

Note that the detection value Is of the alternating current is used for switching between the rectification mode and the high frequency switching mode, as described with reference to FIG. 3.

The determination process of step ST11 described above results in "No" when the detection value Vs of the power supply voltage is zero, but may result in "Yes" for the detection value Vs of zero. That is, The determination process of step ST11 may result in either "Yes" or "No" when the detection value Vs of the power supply voltage is zero.

In the above-described manner, the first arm pulse generation unit 24 can generate the first drive pulse Xa for the first upper-arm element 311 and the second drive pulse Xb for the first lower-arm element 312.

Figure 10:
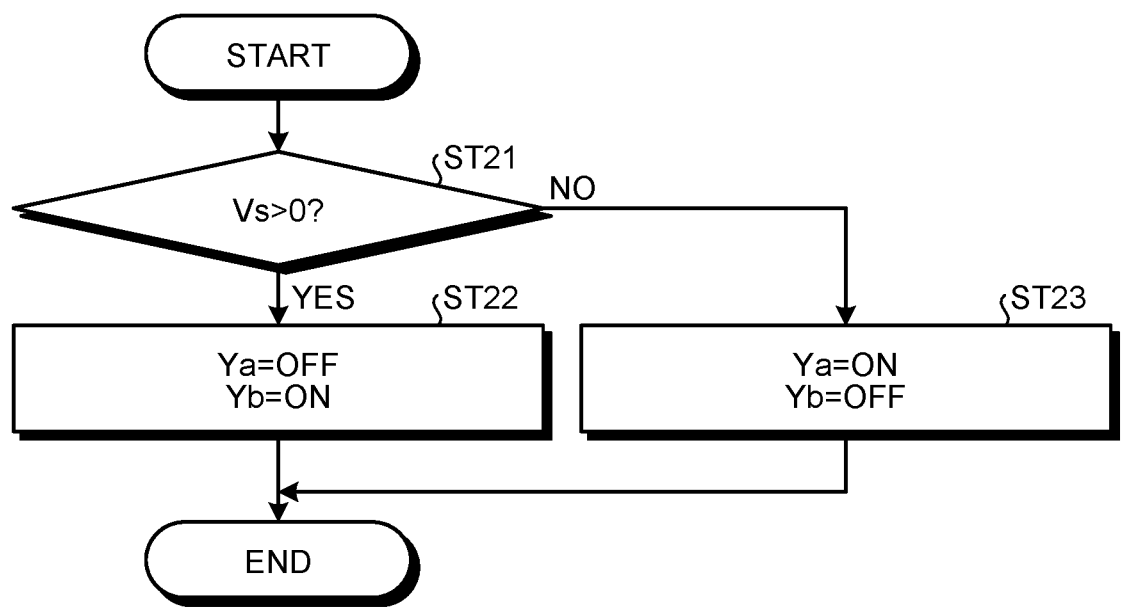
FIG. 10 is a flowchart for explaining the operation of a second arm pulse generation unit illustrated in FIG. 4.

Next, the operation of the second arm pulse generation unit 25 will be described. FIG. 10 is a flowchart for explaining the operation of the second arm pulse generation unit 25 illustrated in FIG. 4. Although the detailed configuration of the second arm pulse generation unit 25 is not illustrated, the second arm pulse generation unit 25 can be configured in the same manner as the first arm pulse generation unit 24 illustrated in FIG. 6.

In FIG. 10, when the detection value Vs of the power supply voltage is positive (step ST21: Yes), the second arm pulse generation unit 25 sets the third drive pulse Ya for the second upper-arm element 321 to an OFF level signal, and sets the fourth drive pulse Yb for the second lower-arm element 322 to an ON level signal (step ST22). When the detection value Vs of the power supply voltage is negative or zero (step ST21: No), the second arm pulse generation unit 25 sets the third drive pulse Ya for the second upper-arm element 321 to an ON level signal, and sets the fourth drive pulse Yb for the second lower-arm element 322 to an OFF level signal (step ST23). These controls aim to achieve low loss through synchronous rectification by utilizing the characteristics of MOSFETs that allow current to flow in both directions. Details of these controls will be described later.

The determination process of step ST21 described above results in "No" when the detection value Vs of the power supply voltage is zero, but may result in "Yes" for the detection value Vs of zero. That is, The determination process of step ST21 may result in either "Yes" or "No" when the detection value Vs of the power supply voltage is zero.

The above-described control procedures in FIGS. 9 and 10 cause the first upper-arm element 311, the first lower-arm element 312, the second upper-arm element 321, and the second lower-arm element 322 to operate so that the bus voltage and the alternating current are controlled.

Figure 11:
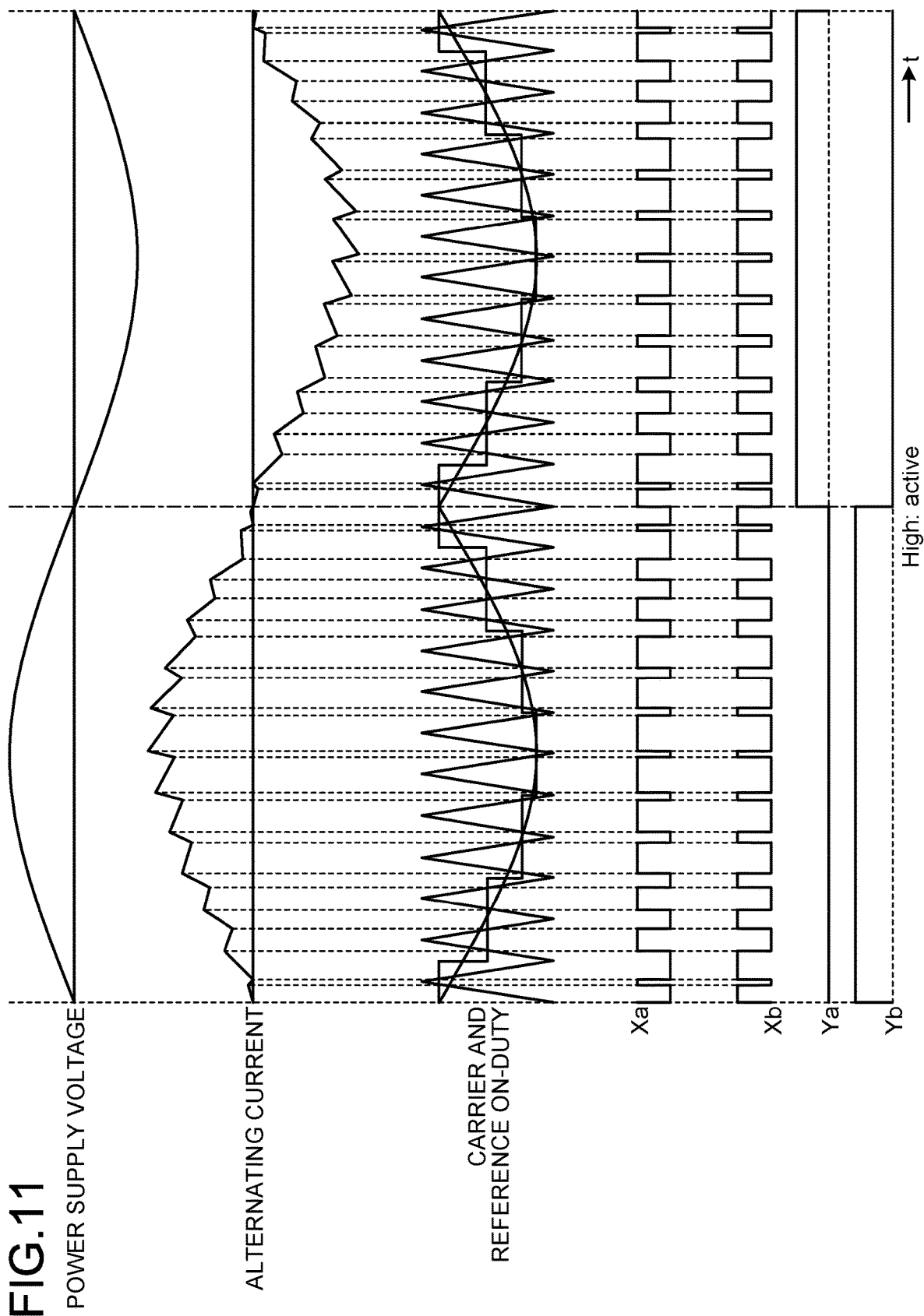
FIG. 11 is a diagram illustrating an example of operation waveforms that occur when a bridge circuit is PWM-controlled by the drive pulse generation unit in the first embodiment.

FIG. 11 is a diagram illustrating an example of operation waveforms that occur when the bridge circuit 3 is PWM-controlled by the drive pulse generation unit 10a in the first embodiment. In FIG. 11, the horizontal axis represents time, and the vertical axis represents, from the upper side, the power supply voltage, the alternating current, the carrier and reference on-duty, the first drive pulse Xa, the second drive pulse Xb, the third drive pulse Ya, and the fourth drive pulse Yb. When the frequency of the triangular-wave carrier illustrated in FIG. 11 is set to several kHz to several tens of kHz, the bridge circuit is operated in the high frequency switching mode described in the first embodiment.

In FIG. 11, the alternating current repeats small fluctuations every carrier cycle, but the peak value or average value of the waveform that repeats small fluctuations is controlled in a sine wave shape. Controlling the peak value or the average value of the waveform of the alternating current in a sine wave shape means that the harmonic component of the alternating current is reduced.

Next, synchronous rectification in the first embodiment will be described. In the first embodiment, synchronous rectification can be used in both the rectification mode and the high frequency switching mode.

Figure 12:
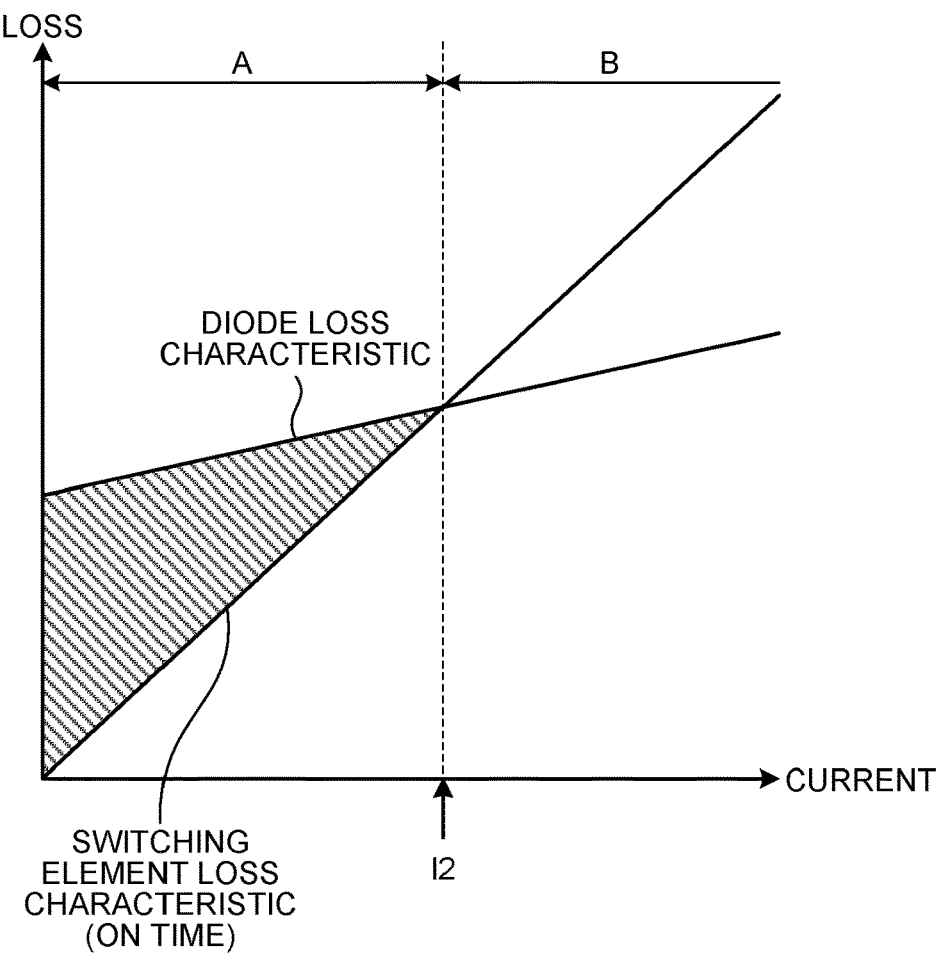
FIG. 12 is a diagram schematically illustrating the current-loss characteristics of a typical switching element.

FIG. 12 is a diagram schematically illustrating the current-loss characteristics of a typical switching element. In FIG. 12, the loss characteristic of the parasitic diode and the on-time loss characteristic of the switching element are illustrated. Here, the current value at which a relation between the loss value of the loss characteristic of the parasitic diode and the loss value of the loss characteristic of the switching element is reversed is defined as a second current I2. When the current value is smaller than the second current I2, the loss characteristic of the switching element is smaller than that of the parasitic diode. This region is referred to as the "low current region A". When the current value is larger than the second current I2, the loss characteristic of the parasitic diode is smaller than that of the switching element. This region is referred to as the "high current region B". Note that the value of the second current I2 is stored in the computing element of the control unit 10 or stored in a memory readable by the control unit 10. The memory readable by the control unit 10 may be outside the control unit 10.

In a case where a switching element is a MOSFET, the MOSFET has the characteristic that allows current to flow in both directions, that is, bidirectionality. The term "bidirectionality" as used herein means that when an on command is given to the gate of a MOSFET, the MOSFET becomes an ON state to allow current to flow in either of the direction from the drain to the source and the direction from the source to the drain are put into the ON state. That is, the bidirectionality means to allow bidirectional flow of current through the switching element. Bidirectionality is distinct from the characteristics of other types of switching elements such as bipolar transistors and IGBTs, which can conduct current only in one direction. The switching element having the bidirectionality characteristic is used, in which case, within the low current region A illustrated in FIG. 12, current flows not through the parasitic diode or the antiparallel diode, but through the switching element at the same timing as current would otherwise flow through such a diode. Such current flow control is called synchronous rectification. The application of synchronous rectification in the low current region A can achieve lower conduction loss than non-application of synchronous rectification, so that the efficiency of the direct-current power supply apparatus 100 can be improved.

Note that there is no direct relationship between the first current I1 illustrated in FIG. 2 and the second current I2 illustrated in FIG. 12. Therefore, the magnitude relationship between the first current I1 and the second current I2 may be I1>I2 or I1<I2. Here, in the case of I1<I2, a part of the operation region in the high frequency switching mode is included in the low current region A. When the relationship I1<I2 holds true, it is possible to achieve low loss and high efficiency by performing synchronous rectification in the high frequency switching mode.

Next, current paths that are formed during the active operation of the bridge circuit 3 in the first embodiment will be described with reference to FIGS. 13 to 16.

Figure 13:
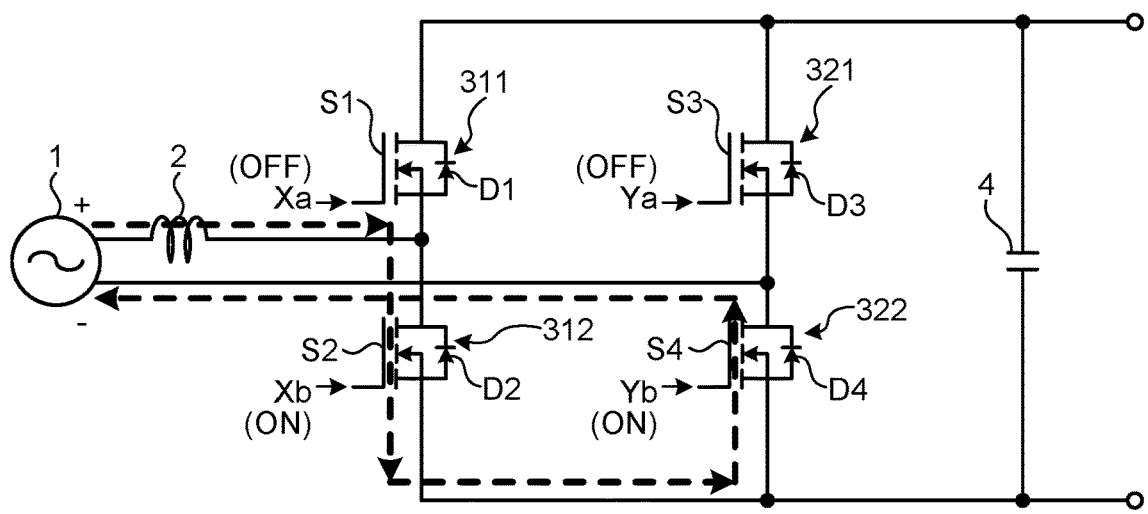
FIG. 13 is a first diagram illustrating a current path that is formed during the active operation of the bridge circuit in the first embodiment.

FIG. 13 is a first diagram illustrating a current path that is formed during the active operation of the bridge circuit 3 in the first embodiment. FIG. 13 illustrates a short-circuit path running from the alternating-current power supply 1 through the reactor 2 back to the alternating-current power supply 1 when the power supply voltage is positive and synchronous rectification is performed. Note that, as illustrated in FIG. 13, the polarity of the power supply voltage is positive as the upper terminal of the alternating-current power supply 1 has a positive potential. The polarity of the power supply voltage is negative as the upper terminal of the alternating-current power supply 1 has a negative potential. "Positive polarity" means that the polarity of the power supply voltage is positive, and "negative polarity" means that the polarity of the power supply voltage is negative.

The state illustrated in FIG. 13 corresponds to the state of operation waveforms in FIG. 11 in which the first drive pulse Xa is "OFF", the second drive pulse Xb is "ON", the third drive pulse Ya is "OFF", and the fourth drive pulse Yb is "ON". As a result, the switching element S2 of the first lower-arm element 312 and the switching element S4 of the second lower-arm element 322 are controlled such that the switching elements S2 and S4 are ON, while the switching element S1 of the first upper-arm element 311 and the switching element S3 of the second upper-arm element 321 are controlled such that the switching elements S1 and S3 are OFF. At this time, as illustrated in FIG. 13, a current flows from the alternating-current power supply 1 through the reactor 2, the switching element S2 of the first lower-arm element 312, and the switching element S4 of the second lower-arm element 322, to the alternating-current power supply 1. As a result, energy is stored in the reactor 2.

Figure 14:
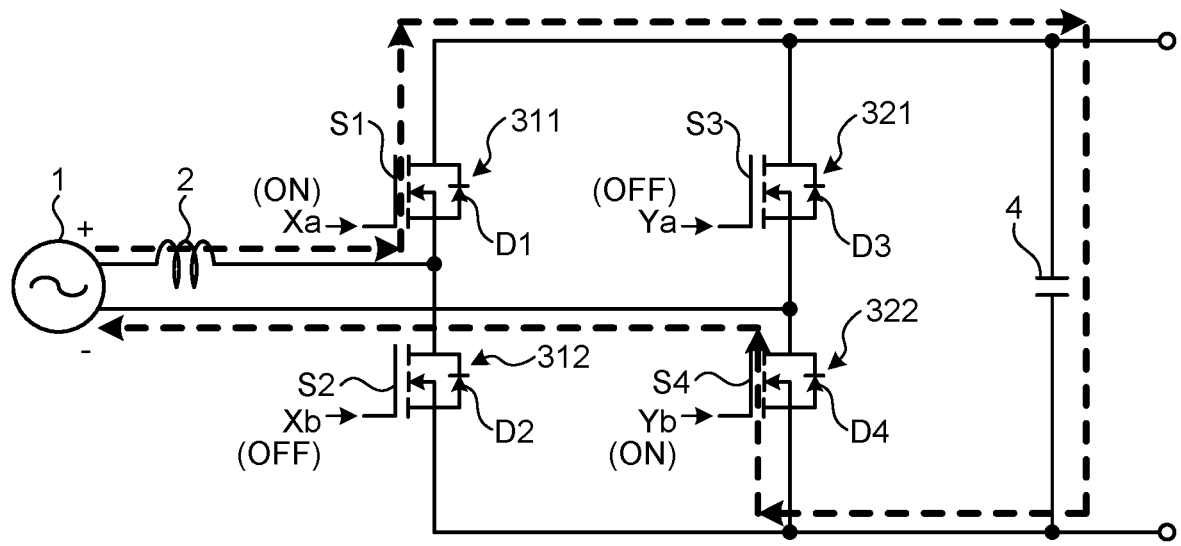
FIG. 14 is a second diagram illustrating a current path that is formed during the active operation of the bridge circuit in the first embodiment.

FIG. 14 is a second diagram illustrating a current path that is formed during the active operation of the bridge circuit 3 in the first embodiment. FIG. 14 illustrates a charging path for the smoothing capacitor 4 when the power supply voltage is positive and synchronous rectification is performed.

The state illustrated in FIG. 14 corresponds to the state of operation waveforms in FIG. 11 in which the first drive pulse Xa is "ON", the second drive pulse Xb is "OFF", the third drive pulse Ya is "OFF", and the fourth drive pulse Yb is "ON". As a result, the switching element S1 of the first upper-arm element 311 and the switching element S4 of the second lower-arm element 322 are controlled such that the switching elements S1 and S4 are ON while the switching element S2 of the first lower-arm element 312 and the switching element S3 of the second upper-arm element 321 are controlled such that the switching elements S2 and S3 are OFF. At this time, as illustrated in FIG. 14, a current flows from the alternating-current power supply 1 through the reactor 2, the switching element S1 of the first upper-arm element 311, the smoothing capacitor 4, and the switching element S4 of the second lower-arm element 322, to the alternating-current power supply 1. As a result, the smoothing capacitor 4 is charged. At this time, the energy stored in the reactor 2 is used, whereby the charging voltage of the smoothing capacitor 4 can be boosted to exceed the power supply voltage.

Figure 15:
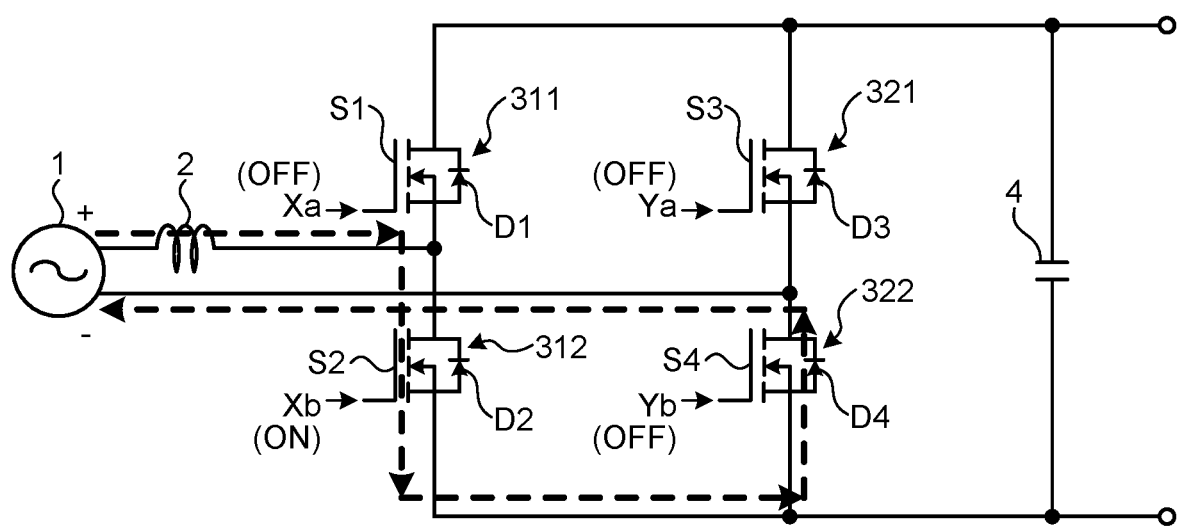
FIG. 15 is a third diagram illustrating a current path that is formed during the active operation of the bridge circuit in the first embodiment.

FIG. 15 is a third diagram illustrating a current path that is formed during the active operation of the bridge circuit 3 in the first embodiment. FIG. 15 illustrates a short-circuit path running from the alternating-current power supply 1 through the reactor 2 to the alternating-current power supply 1 when the power supply voltage is positive and synchronous rectification is not performed.

In FIG. 15, the first drive pulse Xa is "OFF", the second drive pulse Xb is "ON", the third drive pulse Ya is "OFF", and the fourth drive pulse Yb is "OFF". FIG. 15 differs from FIG. 13 in that the fourth drive pulse Yb is "OFF". As a result, the switching element S2 of the first lower-arm element 312 is controlled such that the switching element S2 is ON while the switching element S1 of the first upper-arm element 311, the switching element S3 of the second upper-arm element 321, and the switching element S4 of the second lower-arm element 322 are controlled such that the switching elements S1, S3, and S4 are OFF. At this time, as illustrated in FIG. 15, a current flows from the alternating-current power supply 1 through the reactor 2, the switching element S2 of the first lower-arm element 312 and the diode D4 of the second lower-arm element 322 to the alternating-current power supply 1.

Figure 16:
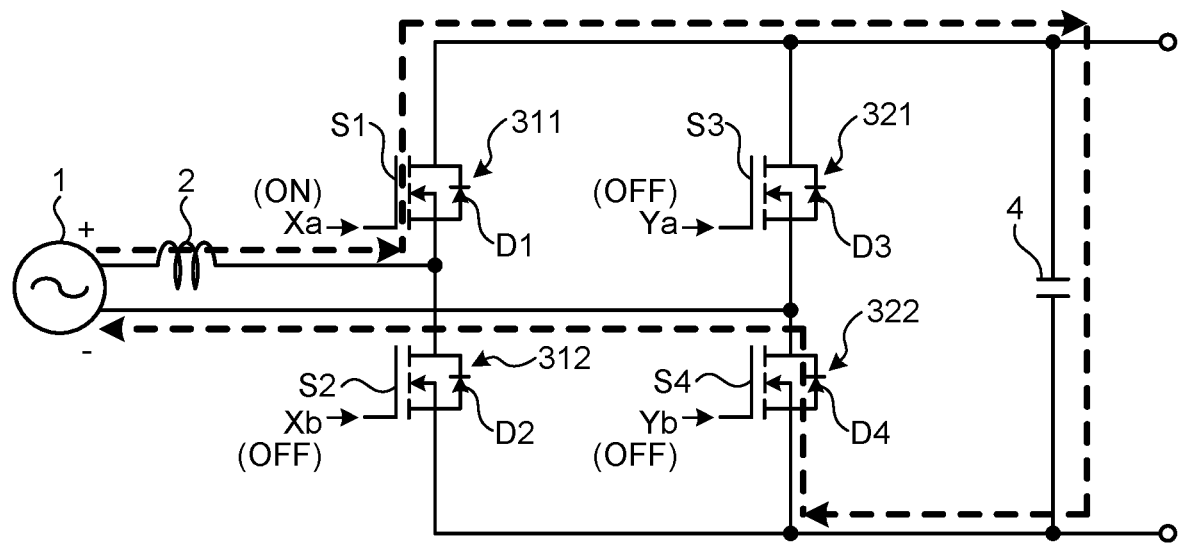
FIG. 16 is a fourth diagram illustrating a current path that is formed during the active operation of the bridge circuit in the first embodiment.

FIG. 16 is a fourth diagram illustrating a current path that is formed during the active operation of the bridge circuit 3 in the first embodiment. FIG. 16 illustrates a charging path for the smoothing capacitor 4 when the power supply voltage is positive and synchronous rectification is not performed.

In FIG. 16, the first drive pulse Xa is "ON", the second drive pulse Xb is "OFF", the third drive pulse Ya is "OFF", and the fourth drive pulse Yb is "OFF". FIG. 16 differs from FIG. 14 in that the fourth drive pulse Yb is "OFF". As a result, the switching element S1 of the first upper-arm element 311 is controlled such that the switching element S1 is ON while the switching element S2 of the first lower-arm element 312, the switching element S3 of the second upper-arm element 321, and the switching element S4 of the second lower-arm element 322 are controlled such that the switching elements S2, S3, and S4 are OFF. At this time, as illustrated in FIG. 16, a current flows from the alternating-current power supply 1 through the reactor 2, the switching element S1 of the first upper-arm element 311, the smoothing capacitor 4, and the diode D4 of the second lower-arm element 322 to the alternating-current power supply 1.

Whether or not to perform synchronous rectification actively in the high frequency switching mode can be determined simply in view of the characteristics of the reactor 2 used in the direct-current power supply apparatus 100 and the characteristics of the switching elements used in the bridge circuit 3, as described above. Specifically, if the effect of conduction loss reduction can be obtained by synchronous rectification, a more preferable embodiment is to perform synchronous rectification in the high frequency switching mode.

The active operation of the bridge circuit 3 within the half-cycle with the positive power supply voltage has been described above with reference to FIGS. 13 to 16. The same applies to the active operation of the bridge circuit 3 within the half-cycle with the negative power supply voltage except that while the upper arm element of the bridge circuit 3 is in operation during one of the positive and negative polarities of the power supply voltage, the lower arm element is operated during the other polarity of the power supply voltage. Thus, a detailed description of the operation of the bridge circuit with the negative power supply voltage is omitted.

Next, current paths that are formed during the passive operation of the bridge circuit 3 in the first embodiment will be described with reference to FIGS. 17 and 18.

Figure 17:
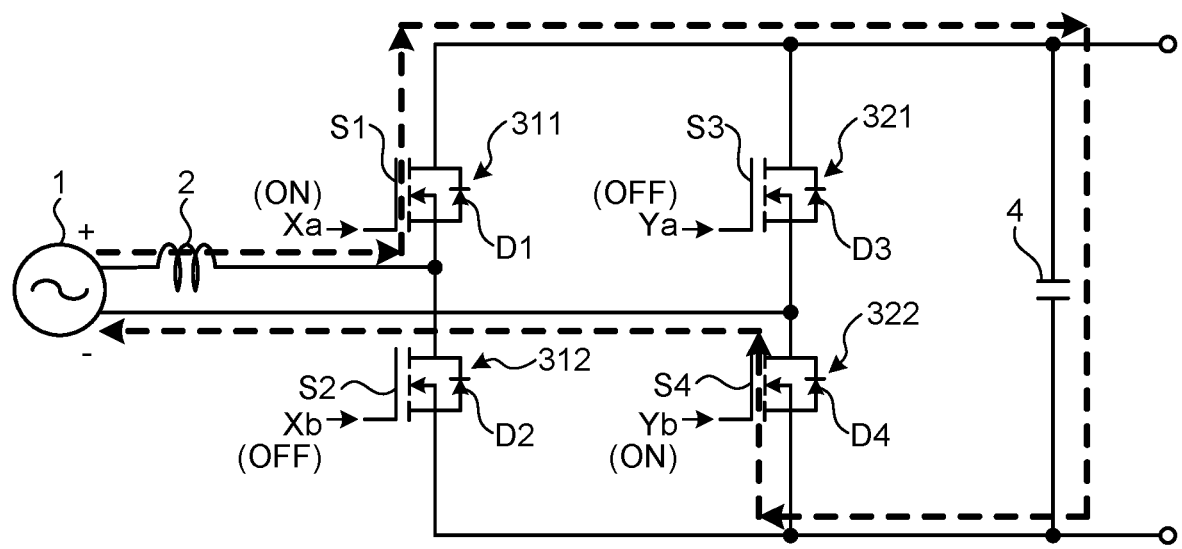
FIG. 17 is a first diagram illustrating a current path that is formed during the passive operation of the bridge circuit in the first embodiment.

FIG. 17 is a first diagram illustrating a current path that is formed during the passive operation of the bridge circuit 3 in the first embodiment. FIG. 17 illustrates a charging path for the smoothing capacitor 4 when the power supply voltage is positive and synchronous rectification is performed.

In FIG. 17, the first drive pulse Xa is "ON", the second drive pulse Xb is "OFF", the third drive pulse Ya is "OFF", and the fourth drive pulse Yb is "ON". As a result, the switching element S1 of the first upper-arm element 311 and the switching element S4 of the second lower-arm element 322 are controlled such that the switching elements S1 and S4 are ON while the switching element S2 of the first lower-arm element 312 and the switching element S3 of the second upper-arm element 321 are controlled such that the switching elements S2 and S3 are OFF. At this time, as illustrated in FIG. 17, a current flows from the alternating-current power supply 1 through the reactor 2, the switching element S1 of the first upper-arm element 311, the smoothing capacitor 4, and the switching element S4 of the second lower-arm element 322, to the alternating-current power supply 1. As a result, the smoothing capacitor 4 is charged.

Note that the current path illustrated in FIG. 17 is the same as that illustrated in FIG. 14, but differs in the operation cycle of the switching elements. In the case of FIG. 17, both the switching element S1 of the first upper-arm element 311 and the switching element S4 of the second lower-arm element 322 are switching-controlled in the power supply cycle. In contrast, in the case of FIG. 14, the switching element S4 of the second lower-arm element 322 is switching-controlled in the power supply cycle, and the switching element S1 of the first upper-arm element 311 is switching-controlled in the carrier cycle.

Figure 18:
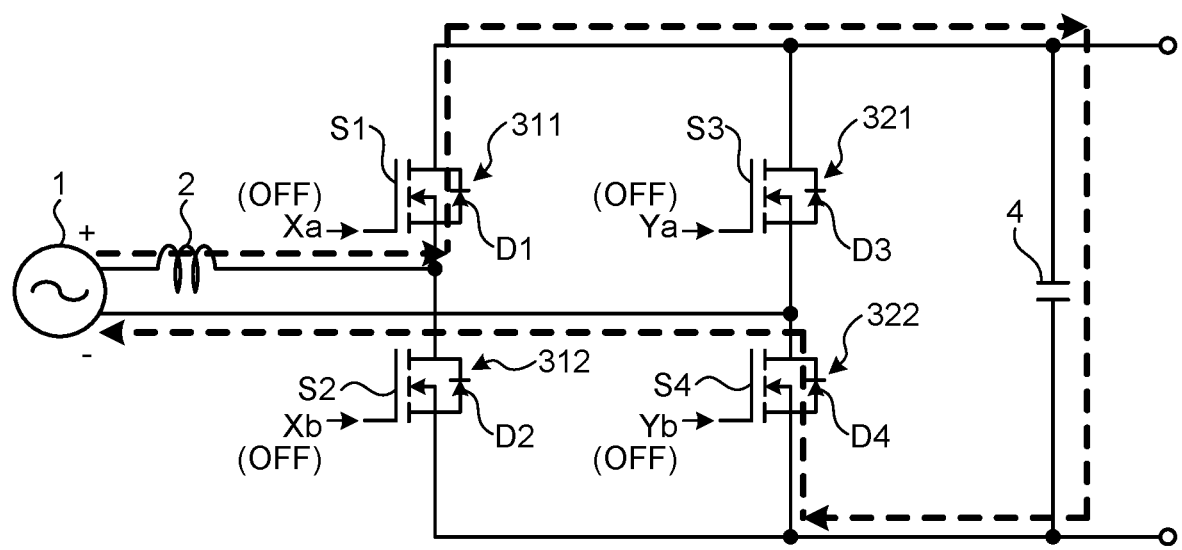
FIG. 18 is a second diagram illustrating a current path that is formed during the passive operation of the bridge circuit in the first embodiment.

FIG. 18 is a second diagram illustrating a current path that is formed during the passive operation of the bridge circuit 3 in the first embodiment. FIG. 18 illustrates a charging path for the smoothing capacitor 4 when the power supply voltage is positive and synchronous rectification is not performed.

In FIG. 18, the first drive pulse Xa, the second drive pulse Xb, the third drive pulse Ya, and the fourth drive pulse Yb are all "OFF". FIG. 18 differs from FIG. 17 in that the first drive pulse Xa and the fourth drive pulse Yb are both "OFF". As a result, the switching element S1 of the first upper-arm element 311, the switching element S2 of the first lower-arm element 312, the switching element S3 of the second upper-arm element 321, and the switching element S4 of the second lower-arm element 322 are controlled such that the switching elements S1, S2, S3, and S4 are all OFF. At this time, as illustrated in FIG. 18, a current flows from the alternating-current power supply 1 through the reactor 2, the diode D1 of the first upper-arm element 311, the smoothing capacitor 4, and the diode D4 of the second lower-arm element 322 to the alternating-current power supply 1.

For the current-loss characteristics of a typical switching element, the loss characteristic of the switching element is smaller than that of the parasitic diode when the current value is smaller than the second current I2, as described above with reference to FIG. 12. In the present embodiment, the operation region where the rectification mode is applied is the region where the current value is smaller than the second current I2. Synchronous rectification is switching control in the power supply cycle, and does not increase switching loss. Therefore, the efficiency of the direct-current power supply apparatus 100 can be improved by using synchronous rectification.

In a case where the diode connected in antiparallel to the switching element is not a parasitic diode but a diode with a small loss, passive operation without synchronous rectification may be performed.

The passive operation of the bridge circuit 3 within the half-cycle with the positive power supply voltage has been described above with reference to FIGS. 17 and 18. The same applies to the half-cycle passive operation of the bridge circuit 3 with the negative power supply voltage except that while the upper arm element of the bridge circuit 3 is in operation during one of the positive and negative polarities of the power supply voltage, the lower arm element is operated during the other polarity of the power supply voltage. Thus, a detailed description of the passive operation of the bridge circuit is omitted.

Figure 19:
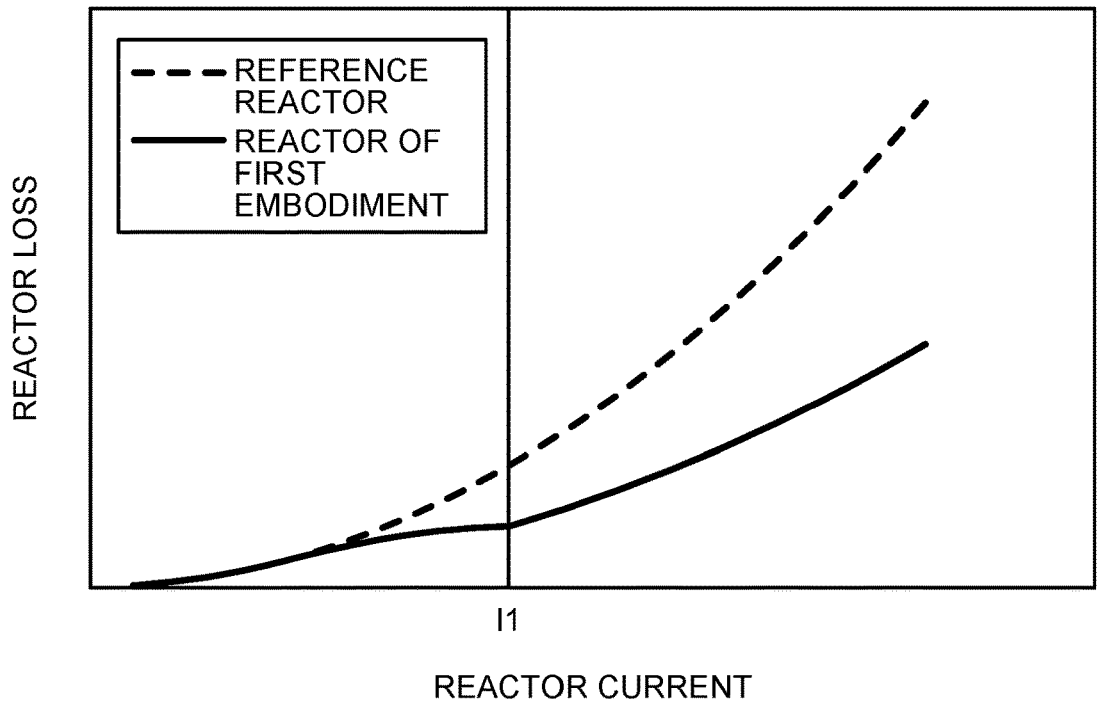
FIG. 19 is a first diagram for explaining effects of the direct-current power supply apparatus according to the first embodiment.
Figure 20:
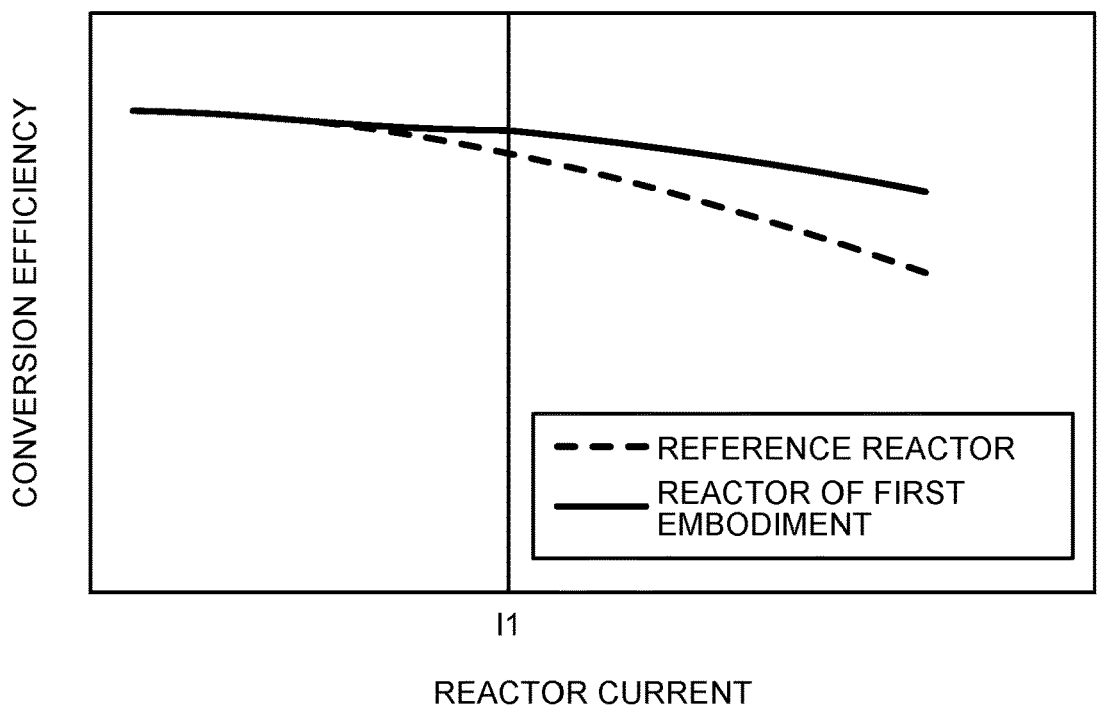
FIG. 20 is a second diagram for explaining effects of the direct-current power supply apparatus according to the first embodiment.

Next, effects obtained by the direct-current power supply apparatus 100 according to the first embodiment will be described with reference to FIGS. 19 and 20. FIG. 19 is a first diagram for explaining effects of the direct-current power supply apparatus 100 according to the first embodiment. FIG. 20 is a second diagram for explaining effects of the direct-current power supply apparatus 100 according to the first embodiment.

In FIG. 19, the horizontal axis represents the reactor current, and the vertical axis represents the reactor loss. In FIG. 20, the horizontal axis represents the reactor current, and the vertical axis represents the conversion efficiency. Note that the efficiency is the conversion efficiency of output power relative to input power. In FIGS. 19 and 20, the solid line is the reactor loss or efficiency characteristic in the bridge circuit when the reactor of the first embodiment is used, and the broken line is the reactor loss or efficiency characteristic in the bridge circuit when a reference reactor is used.

The characteristics of the reactor of the first embodiment are as illustrated in FIG. 2. Assume that the reference reactor has a fixed inductance (=L1). The first current I1 is plotted on the horizontal axis of FIGS. 19 and 20, as in FIG. 2. In order to compare the reactor of the first embodiment and the reference reactor in terms of the reactor loss and the efficiency under the same conditions, regardless of whether the reactor of the first embodiment or the reference reactor is used, the passive operation involving the synchronous rectification is performed in the region lower than the first current I1 and the active operation involving the synchronous rectification is performed in the region not lower than the first current I1.

As illustrated in FIG. 19, in the case of the reference reactor, the reactor loss in the bridge circuit increases like a quadratic function with respect to the reactor current. In contrast, in the case of the reactor of the first embodiment, as illustrated in FIG. 2, the inductance of the reactor has a characteristic of "drooping", or dropping in an inverted L-shape with respect to the reactor current, and is set to particularly suit the high-load operation region. The operation region where the reactor current is larger than the first current I1 corresponds to the high-load operation region. Therefore, as illustrated in FIG. 19, the reactor loss can be significantly reduced particularly in the high-load operation region. The reduction of the reactor loss can lead to an improvement in the conversion efficiency as illustrated in FIG. 20.

As described above, the reactor used in the direct-current power supply apparatus according to the first embodiment is connected between the alternating-current power supply and the bridge circuit and has a characteristic of reducing an inductance in accordance with an increase in the alternating current and, when the alternating current exceeds a first current, having an inductance lower than one third of an inductance at which a current does not flow in the reactor. Then, the bridge circuit performs the active operation when the detection value of the alternating current is larger than or equal to the first current and performs the passive operation when the detection value of the alternating current is lower than the first current. As a result, reactor loss is reduced particularly in the high-load operation region.

Because the direct-current power supply apparatus according to the first embodiment can reduce reactor loss, the generation of heat in the reactor can be reduced. This can contribute to reducing the size of the reactor, as compared with the case where the inductance of the reactor is selected according to the regulations on harmonics in the light-load operation region.

Second Embodiment

Figure 21:
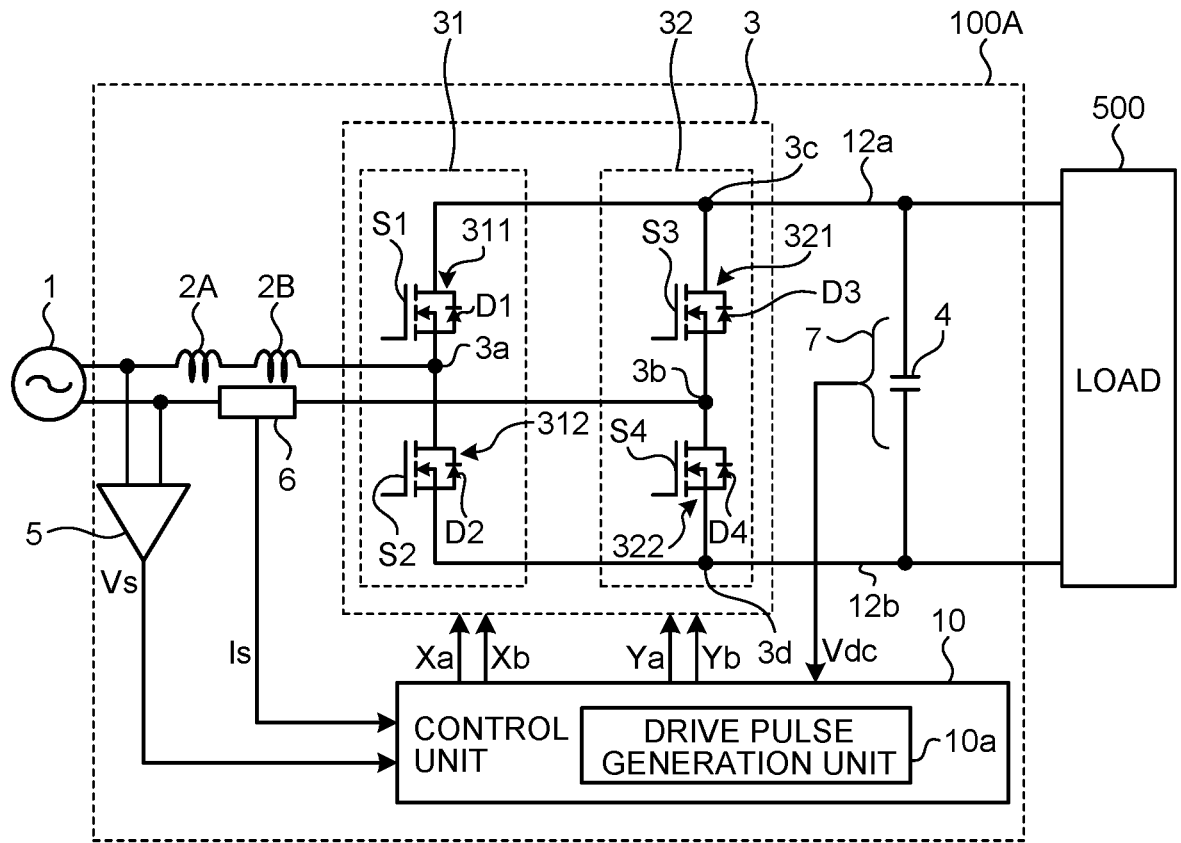
FIG. 21 is a circuit diagram illustrating a first configuration of a direct-current power supply apparatus according to a second embodiment.

FIG. 21 is a circuit diagram illustrating a first configuration of a direct-current power supply apparatus 100A according to the second embodiment. The direct-current power supply apparatus 100A according to the second embodiment is obtained by replacing the reactor 2 of the direct-current power supply apparatus 100 according to the first embodiment illustrated in FIG. 1 with two reactors: a first reactor 2A and a second reactor 2B. The other configuration is the same as or equivalent to the configuration in FIG. 1. The same or equivalent components are denoted by the same reference signs, and redundant descriptions are omitted.

Figure 22:
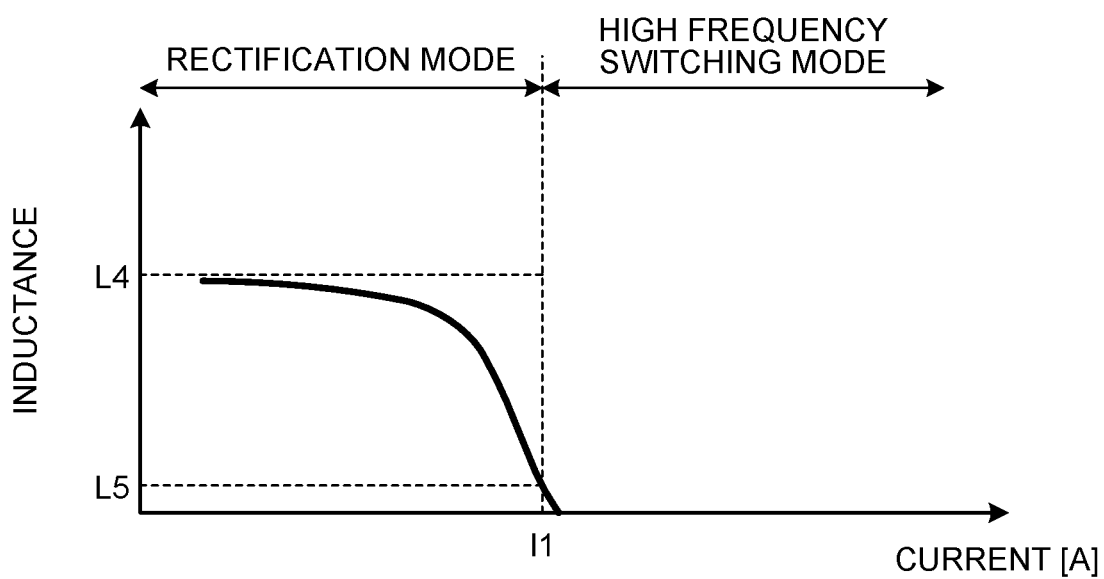
FIG. 22 is a diagram illustrating the current characteristics of the inductance of a first reactor in the second embodiment.
Figure 23:
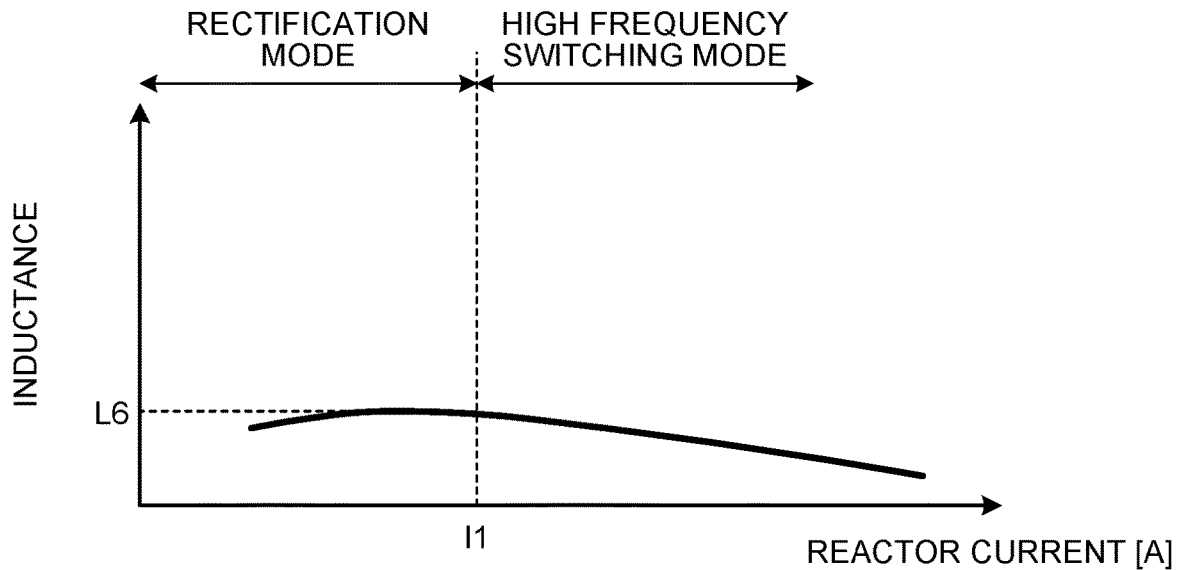
FIG. 23 is a diagram illustrating the current characteristics of the inductance of a second reactor in the second embodiment.

FIG. 22 is a diagram illustrating the current characteristics of the inductance of the first reactor 2A in the second embodiment. FIG. 23 is a diagram illustrating the current characteristics of the inductance of the second reactor 2B in the second embodiment.

In FIG. 22, L4 is the inductance that occurs when the reactor current does not flow, and is also the maximum inductance of the first reactor 2A. The value of L4 is several mH to several tens of mH. The inductance of the first reactor 2A is substantially maintained at L4 relative to an increase in the reactor current, and sharply decreases immediately before the reactor current reaches the first current I1. That is, the reactor 2 in the first embodiment has the characteristic that the inductance "droops", or drops in an inverted L-shape with respect to the reactor current as the reactor current approaches the first current I1. Such a drop characteristic can be achieved by providing the first reactor 2A with a characteristic of being saturated at the first current I1.

Here, the value of L5 is set to 1/1000 or less of the value of L4. That is, the relationship between L4 and L5 can be represented by the following formula.

$$L5 \leq L4/1000 \qquad (2)$$

The inductance of the second reactor 2B in the second embodiment has a flat characteristic over the entire operation region of the bridge circuit 3, as illustrated in FIG. 23. Here, the flat characteristic means that the change in the inductance of the second reactor 2B over the entire operation region is within 10% of the maximum inductance L6 of the second reactor 2B. In other words, if the minimum inductance of the second reactor 2B is 90% or more of the maximum inductance L6 of the second reactor 2B in the entire operation region of the bridge circuit 3, the inductance of the second reactor 2B can be regarded as having a flat characteristic.

Next, a specific example for obtaining the current characteristics illustrated in FIG. 2 with the first reactor 2A having the characteristics illustrated in FIG. 22 and the second reactor 2B having the characteristics illustrated in FIG. 23 will be described.

First, assume that the maximum inductance L6 of the second reactor 2B and the maximum inductance L4 of the first reactor 2A have the relationship represented by the following formula.

$$L6=L4/2 \qquad (3)$$

In FIG. 21, the first reactor 2A and the second reactor 2B are connected in series on the circuit. Therefore, the sum of the first reactor 2A and the second reactor 2B becomes the total inductance of the first reactor 2A and the second reactor 2B.

Here, in the operation region in the rectification mode, let Lt1 represent the total inductance at a relatively small reactor current, and let Lt2 represent the total inductance at the first current I1. Lt1 and Lt2 can be roughly converted into the following formulas.

$$Lt1=L4+L6=$$

$$2\times L6+L6=$$

$$3\times L6 \qquad (4)$$

$$Lt2=L5+L6\approx$$

$$0+L6=$$

$$L6 \qquad (5)$$

From Formulas (4) and (5), the relationship represented by the following formula holds between Lt1 and Lt2.

$$Lt1:Lt2=3:1 \qquad (6)$$

The relationship of Formula (6) is the same as the relationship in the first embodiment between the inductance L1 that occurs when the reactor current does not flow and the inductance L3 at the first current I1. Therefore, the configuration of FIG. 21, in which the first reactor 2A having the characteristics illustrated in FIG. 22 and the second reactor 2B having the characteristics illustrated in FIG. 23 are connected in series, is equivalent to the configuration of FIG. 1.

Note that the example represented by Formula (3) is a non-limiting example for making the relationship of Formula (6) match the relationship of Formula (1). It is preferable, for example, that the ratio of the difference between half of the maximum inductance L4 of the first reactor 2A and the maximum inductance L6 of the second reactor 2B to half of the maximum inductance L4 of the first reactor 2A be within the range of ±10%.

This relationship can be represented by the following formula.

$$-0.1\leq\{(L4)/2-L6\}/\{(L4)/2\}\leq 0.1 \qquad (7)$$

Formula (7) can be modified to be represented by the following formula.

$$0.45\times L4\leq L6\leq 0.55\times L4 \qquad (8)$$

Formula (8) shows that the maximum inductance L6 of the second reactor 2B only needs to be set to a value within the range of 45% to 55% of the maximum inductance L4 of the first reactor 2A.

Figure 24:
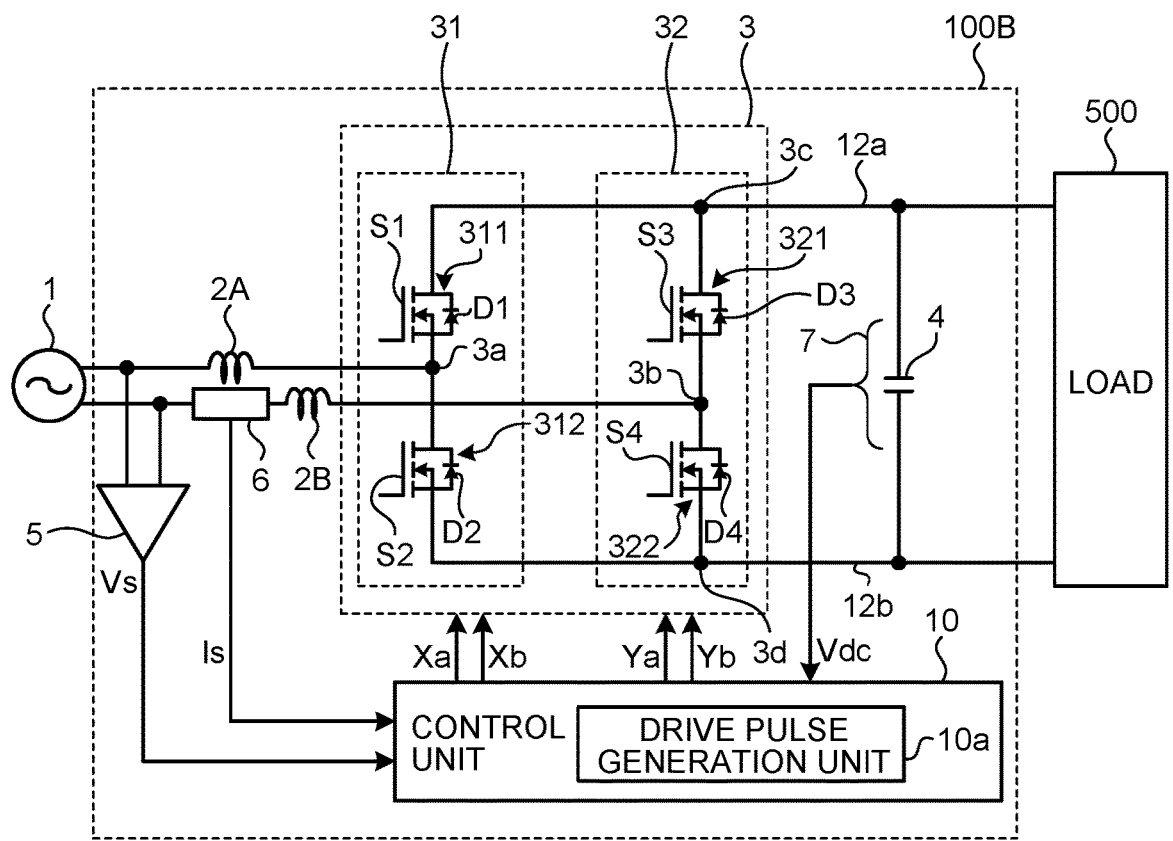
FIG. 24 is a circuit diagram illustrating a configuration of a direct-current power supply apparatus according to a modification of the second embodiment.

FIG. 24 is a circuit diagram illustrating a configuration of a direct-current power supply apparatus 100B according to a modification of the second embodiment. The direct-current power supply apparatus 100B according to the second embodiment is obtained by modifying the configuration of the direct-current power supply apparatus 100A according to the second embodiment illustrated in FIG. 21 such that one reactor, namely the first reactor 2A, is connected to the connection point 3a, and the other reactor, namely the second reactor 2B, is connected to the connection point 3b and to the alternating-current power supply 1. Therefore, the configuration of FIG. 24 is equivalent to the configurations of FIGS. 1 and 21.

For the direct-current power supply apparatus according to the second embodiment, the reactor connected between the alternating-current power supply and the bridge circuit includes the first reactor and the second reactor, as described above. The first reactor has a characteristic of "drooping", or dropping an inductance in an inverted L-shape with respect to the alternating current as the alternating current approaches the first current. The second reactor has a flat characteristic over an entire operation region of the bridge circuit. This makes it possible to relatively easily achieve the current characteristics of the inductance described in the first embodiment with reference to FIG. 2.

Because the direct-current power supply apparatus according to the second embodiment is implemented by the two reactors, the first reactor and the second reactor, the amount of heat generation from the reactors can be dispersed. As a result, it is possible to prevent uneven heat distribution in the apparatus, and thus the effect of facilitating thermal design can be obtained.

Although the characteristics illustrated in FIG. 2 are achieved by a single first reactor and a single second reactor in the examples of FIG. 21 and FIG. 24, at least one of the first reactor and the second reactor may include a plurality of reactors. As a result, the characteristics illustrated in FIG. 2 are achieved with at least three or more reactors. Three or more reactors enable further dispersion of the amount of heat generation from the reactors.

Third Embodiment

The direct-current power supply apparatuses described in the first and second embodiments can be applied to a motor drive control apparatus that supplies direct-current power to an inverter. Hereinafter, an example of the application of the direct-current power supply apparatus 100 described in the first embodiment to a motor drive control apparatus will be described.

Figure 25:
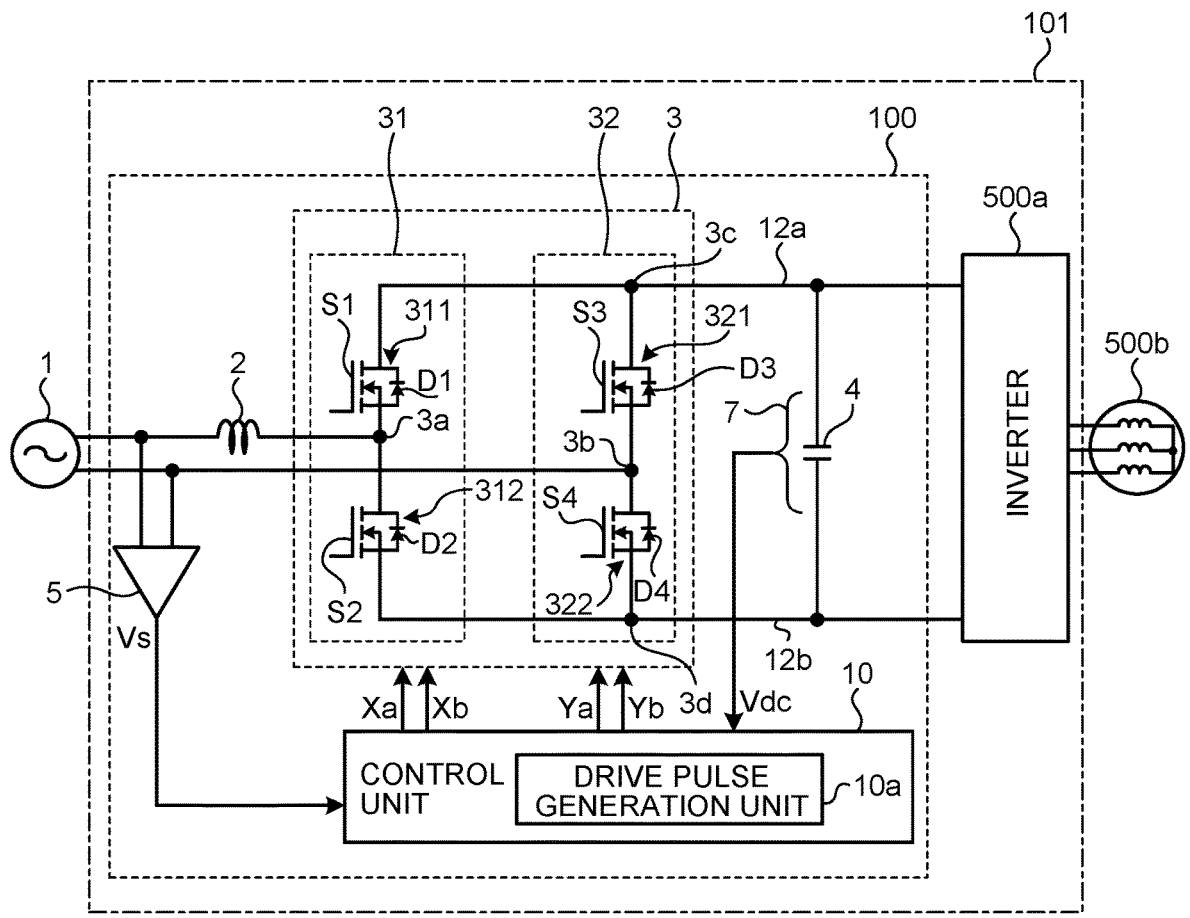
FIG. 25 is a diagram illustrating an example in which the direct-current power supply apparatus described in the first embodiment is applied to a motor drive control apparatus.

FIG. 25 is a diagram illustrating an example in which the direct-current power supply apparatus 100 described in the first embodiment is applied to a motor drive control apparatus 101. The motor drive control apparatus 101 according to the third embodiment illustrated in FIG. 25 includes the direct-current power supply apparatus 100 according to the first embodiment and an inverter 500a. As described above, the direct-current power supply apparatus 100 is an apparatus that converts alternating-current power into direct-current power. The inverter 500a is a device that converts direct-current power output from the direct-current power supply apparatus 100 into alternating-current power.

A motor 500b is connected to the output side of the inverter 500a. The inverter 500a drives the motor 500b by supplying the converted alternating-current power to the motor 500b.

The motor drive control apparatus 101 illustrated in FIG. 25 can be applied to a product such as a blower, a compressor, and an air conditioner.

Figure 26:
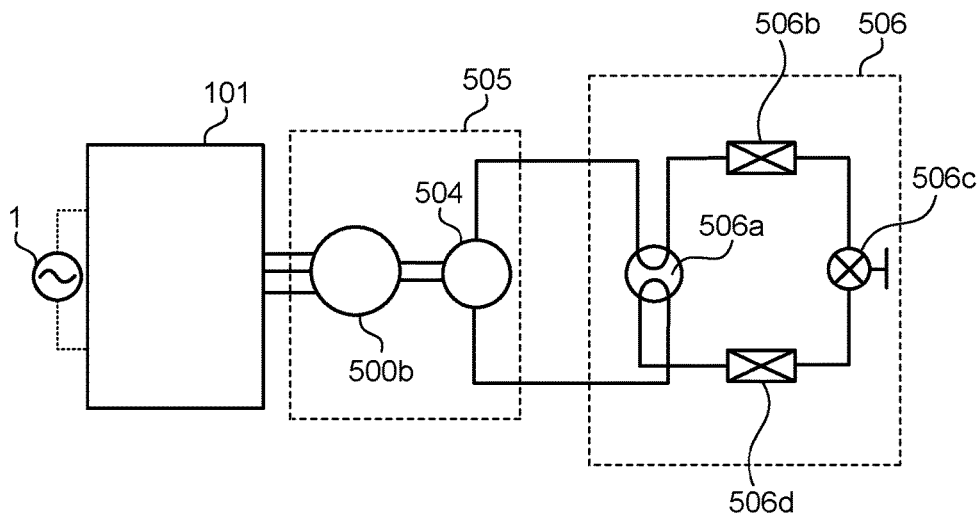
FIG. 26 is a diagram illustrating an example in which the motor drive control apparatus illustrated in FIG. 25 is applied to an air conditioner.

FIG. 26 is a diagram illustrating an example in which the motor drive control apparatus 101 illustrated in FIG. 25 is applied to an air conditioner. The motor 500b is connected to the output side of the motor drive control apparatus 101, and the motor 500b is connected to a compression element 504. A compressor 505 includes the motor 500b and the compression element 504. A refrigeration cycle unit 506 includes a four-way valve 506a, an indoor heat exchanger 506b, an expansion valve 506c, and an outdoor heat exchanger 506d.

The refrigerant circulates through the air conditioner by flowing from the compression element 504 and back to the compression element 504 through the four-way valve 506a, the indoor heat exchanger 506b, the expansion valve 506c, the outdoor heat exchanger 506d, and the four-way valve 506a again. The motor drive control apparatus 101 receives alternating-current power from the alternating-current power supply 1 and rotates the motor 500b. The compression element 504 executes the operation of compressing the refrigerant as the motor 500b rotates, so that the refrigerant can circulate through the refrigeration cycle unit 506.

Although FIG. 25 depicts an example in which the direct-current power supply apparatus 100 described in the first embodiment is applied to the motor drive control apparatus 101, the direct-current power supply apparatuses 100A and 100B described in the second embodiment can also be applied to the motor drive control apparatus 101.

The motor drive control apparatus according to the third embodiment includes the direct-current power supply apparatus according to the first embodiment or the direct-current power supply apparatus according to the second embodiment. As a result, the effects described in the first embodiment or the second embodiment can be obtained in a product such as a blower, a compressor, and an air conditioner to which the motor drive control apparatus according to the third embodiment is applied.

The configurations described in the above-mentioned embodiments indicate examples of the contents of the present invention. The configurations can be combined with another well-known technique, and some of the configurations can be omitted or changed in a range not departing from the gist of the present invention.

REFERENCE SIGNS LIST 1 alternating-current power supply; 2 reactor; 2A first reactor; 2B second reactor; 3 bridge circuit; 3a, 3b, 3c, 3d connection point; 4 smoothing capacitor; 5 first voltage detector; 6 current detector; 7 second voltage detector; 10 control unit; 10a drive pulse generation unit; 12a, 12b direct-current bus; 21 current command value control unit; 22 on-duty control unit; 23 power supply voltage phase calculation unit; 24 first arm pulse generation unit; 25 second arm pulse generation unit; 26, 28 subtractor; 27 multiplier; 31 first leg; 32 second leg; 100, 100A, 100B direct-current power supply apparatus; 101 motor drive control apparatus; 241 carrier generation unit; 242 reference PWM signal generation unit; 243 dead time generation unit; 244 pulse selector unit; 311 first upper-arm element; 312 first lower-arm element; 321 second upper-arm element; 322 second lower-arm element; 500 load; 500a inverter; 500b motor; 504 compression element; 505 compressor; 506 refrigeration cycle unit; 506a four-way valve; 506b indoor heat exchanger; 506c expansion valve; 506d outdoor heat exchanger; D1, D2, D3, D4 diode; S1, S2, S3, S4 switching element.

The invention claimed is:

1. A direct-current power supply apparatus comprising:
a reactor connected at one end to an alternating-current power supply;
a bridge circuit connected to another end of the reactor and converting a first voltage output from the alternating-current power supply into a direct-current voltage, the first voltage being an alternating-current voltage; and
a current detector detecting an alternating current flowing between the alternating-current power supply and the bridge circuit, wherein
the reactor has a characteristic of reducing an inductance in accordance with an increase of the alternating current and causing, when the alternating current exceeds a first current, the inductance to be lower than one third of an inductance when a current does not flow in the reactor,
the inductance of the reactor when the alternating current is equal to the first current is set to one third of the inductance when a current does not flow in the reactor, and
the bridge circuit performs an active operation when a detection value of the alternating current is larger than or equal to the first current and performs a passive operation when the detection value of the alternating current is lower than the first current.

2. The direct-current power supply apparatus according to claim 1, wherein
the reactor includes a first reactor and a second reactor,
the first reactor has a characteristic of dropping an inductance in an inverted L-shape with respect to the alternating current as the alternating current approaches the first current, and
the second reactor has a flat characteristic over an entire operation region of the bridge circuit.

3. The direct-current power supply apparatus according to claim 2, wherein
at least one of the first reactor and the second reactor includes a plurality of reactors.

4. The direct-current power supply apparatus according to claim 1, comprising:
a first voltage detector detecting the first voltage;
a second voltage detector detecting a second voltage, the second voltage being a voltage on a direct-current side of the bridge circuit; and
a control unit controlling the bridge circuit on a basis of a detection value of the first voltage, a detection value of the second voltage, and the detection value of the alternating current, wherein
the bridge circuit includes a first leg in which a first upper-arm element and a first lower-arm element are connected in series, and a second leg in which a second upper-arm element and a second lower-arm element are connected in series,
the first leg and the second leg are connected in parallel, and
during the active operation, the control unit
switching-controls the first upper-arm element and the first lower-arm element in a carrier cycle; and
switching-controls the second upper-arm element and the second lower-arm element in a cycle of the first voltage.

5. The direct-current power supply apparatus according to claim 1, comprising:
a first voltage detector detecting the first voltage;
a second voltage detector detecting a second voltage, the second voltage being a voltage on a direct-current side of the bridge circuit; and
a control unit controlling the bridge circuit based on a detection value of the first voltage, a detection value of the second voltage, and the detection value of the alternating current, wherein
the bridge circuit includes a first leg in which a first upper-arm element and a first lower-arm element are connected in series, and a second leg in which a second upper-arm element and a second lower-arm element are connected in series,
the first leg and the second leg are connected in parallel, and
during the active operation, the control unit switching-controls the first upper-arm element and the first lower-arm element in a carrier cycle; and performs synchronous rectification on the second upper-arm element and the second lower-arm element in the carrier cycle.

6. The direct-current power supply apparatus according to claim 4, wherein during the passive operation, the control unit causes the bridge circuit to operate in a passive mode in which the first upper-arm element, the first lower-arm element, the second upper-arm element, and the second lower-arm element of the bridge circuit are not turned on and off except to perform synchronous rectification, and the control unit performs synchronous rectification on the second upper-arm element and the second lower-arm element in the cycle of the first voltage during the passive operation.

7. The direct-current power supply apparatus according to claim 4, wherein at least one of the first upper-arm element, the first lower-arm element, the second upper-arm element, and the second lower-arm element is formed of a wide bandgap semiconductor.

8. The direct-current power supply apparatus according to claim 7, wherein the wide bandgap semiconductor is silicon carbide, gallium nitride, or diamond.

9. A motor drive control apparatus comprising:

the direct-current power supply apparatus according to claim 1; and an inverter converting direct-current power output from the direct-current power supply apparatus into alternating-current power.

10. The direct-current power supply apparatus according to claim 5, wherein during the passive operation, the control unit causes the bridge circuit to operate in a passive mode in which the first upper-arm element, the first lower-arm element, the second upper-arm element, and the second lower-arm element of the bridge circuit are not turned on and off except to perform synchronous rectification, and the control unit performs synchronous rectification on the second upper-arm element and the second lower-arm element in the cycle of the first voltage during the passive operation.

11. The direct-current power supply apparatus according to claim 5, wherein at least one of the first upper-arm element, the first lower-arm element, the second upper-arm element, and the second lower-arm element is formed of a wide bandgap semiconductor.

12. A blower comprising the motor drive control apparatus according to claim 9.

13. A compressor comprising the motor drive control apparatus according to claim 9.

14. An air conditioner comprising the blower according to claim 12.

15. An air conditioner comprising the compressor according to claim 13.

16. An air conditioner comprising:

a blower comprising a first motor drive control apparatus comprising:

the direct-current power supply apparatus according to claim 1; and an inverter converting direct-current power output from the direct-current power supply apparatus of the first motor drive control apparatus into alternating-current power; and a compressor comprising a second motor drive control apparatus comprising:

the direct-current power supply apparatus according to claim 1; and an inverter converting direct-current power output from the direct-current power supply apparatus of the second motor drive control apparatus into alternating-current power.

* * * * *